(12) United States Patent
Masuda

(10) Patent No.: US 7,601,386 B2
(45) Date of Patent: Oct. 13, 2009

(54) PROCESS FOR FORMING A FILM, PROCESS FOR MANUFACTURING A DEVICE, ELECTRO-OPTICAL DEVICE AND ELECTRONIC EQUIPMENT

(75) Inventor: Takashi Masuda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1023 days.

(21) Appl. No.: 10/867,842

(22) Filed: Jun. 16, 2004

(65) Prior Publication Data

US 2005/0025880 A1 Feb. 3, 2005

(30) Foreign Application Priority Data

| Jul. 11, 2003 | (JP) | ............................. 2003-195824 |
| Jul. 11, 2003 | (JP) | ............................. 2003-195825 |
| Jul. 11, 2003 | (JP) | ............................. 2003-195828 |

(51) Int. Cl.
*B05D 5/12* (2006.01)

(52) U.S. Cl. ...................... 427/71; 427/96.1; 427/96.7; 427/97.3; 427/98.4; 427/99.2

(58) Field of Classification Search ................... 427/71, 427/96.1, 96.7, 99.2, 97.3, 98.4
See application file for complete search history.

(56) References Cited

U.S. PATENT DOCUMENTS

| 2003/0091920 A1* | 5/2003 | Yamauchi et al. ......... 430/110.3 |
| 2003/0151650 A1* | 8/2003 | Masuda et al. ................ 347/96 |
| 2004/0029382 A1* | 2/2004 | Kawase ...................... 438/689 |
| 2004/0160550 A1* | 8/2004 | Stephenson et al. ........... 349/86 |

FOREIGN PATENT DOCUMENTS

| CN | 1247359 A | 3/2000 |
| JP | A-07-315874 | 12/1995 |
| JP | 09-033422 A | 2/1997 |
| JP | A-09-075826 | 3/1997 |
| JP | A-09-201566 | 8/1997 |
| JP | A 11-271753 | 10/1999 |
| JP | A 11-274671 | 10/1999 |
| JP | A-11-340129 | 12/1999 |
| JP | 2000-075106 A | 3/2000 |
| JP | A-2000-157906 | 6/2000 |
| JP | 2001-239661 A | 9/2001 |
| JP | 2001-311025 A | 11/2001 |
| JP | A-2001-327912 | 11/2001 |

(Continued)

*Primary Examiner*—Binh X Tran
(74) *Attorney, Agent, or Firm*—Oliff & Berridge, PLC

(57) ABSTRACT

A liquid material is placed on a substrate as a droplet to form a film on the substrate. At least either one of a concentration of solids in the liquid material and a drying rate of the droplets is used as a parameter to control a form of a dried film of the droplets. Moreover, a first droplet is placed on a substrate, the first droplet is dried to form a dried film of a form in which a thickness of an edge is larger than that of a central part, and a second droplet is placed in a region surrounded by the edge section of a dried film of the first droplet to form a dried film of the second droplet. Furthermore, the liquid material is placed on the substrate as a droplet to form a film on the substrate, and a dried film of the droplet is formed by contracting the droplet.

10 Claims, 19 Drawing Sheets

FOREIGN PATENT DOCUMENTS

| | | |
|---|---|---|
| JP | 2002-002103 A | 1/2002 |
| JP | 2002-003749 A | 1/2002 |
| JP | 2002-116128 A | 4/2002 |
| JP | A-2002-299199 | 10/2002 |
| JP | A-2003-53882 | 2/2003 |
| JP | A-2003-126760 | 5/2003 |
| JP | A-2003-133692 | 5/2003 |
| JP | 2003-240911 A | 8/2003 |
| JP | A-2003-311196 | 11/2003 |
| JP | A-2004-305990 | 11/2004 |

* cited by examiner

FIG. 2
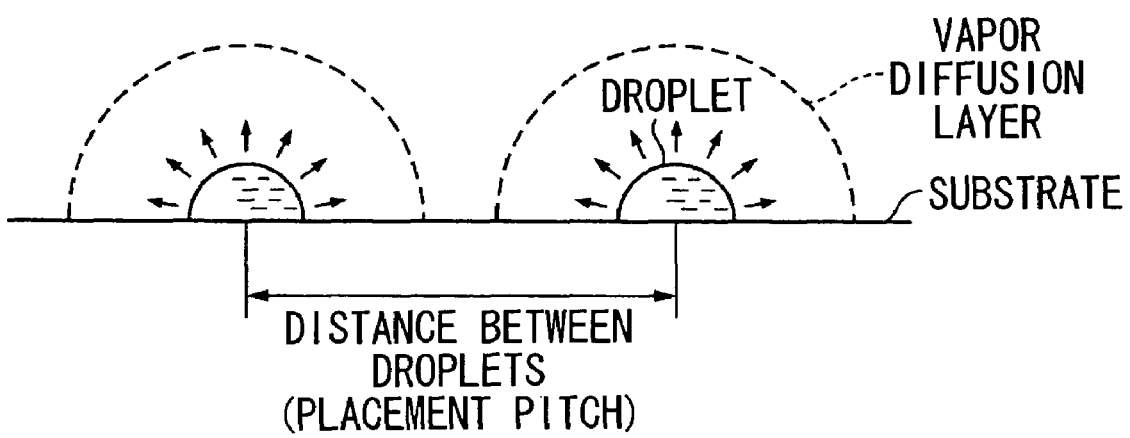
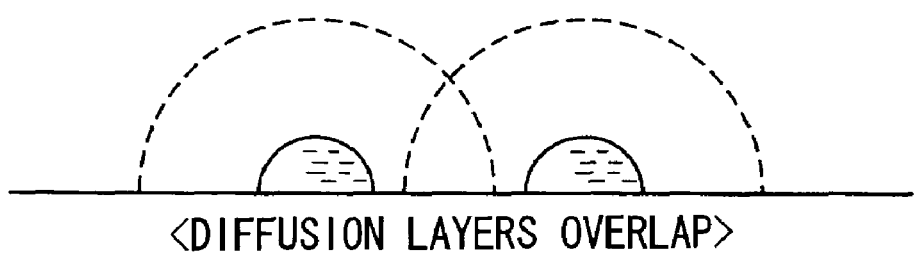
<DIFFUSION LAYERS OVERLAP>
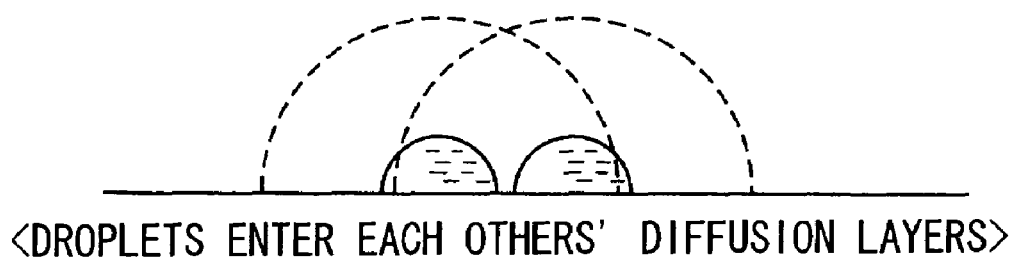
<DROPLETS ENTER EACH OTHERS' DIFFUSION LAYERS>

$W_1 < W_2$
$h_1 < h_2$
$L_1 > L_2$

FIG. 10A
FIG. 10B
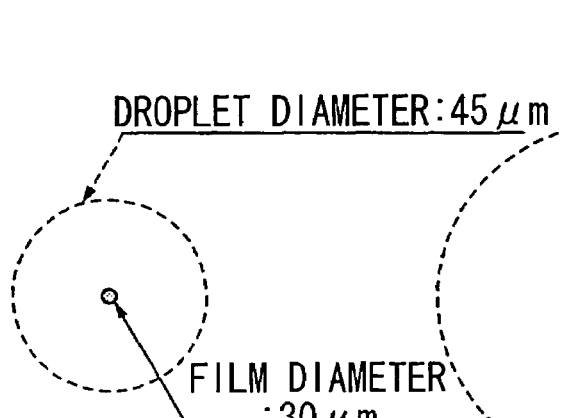
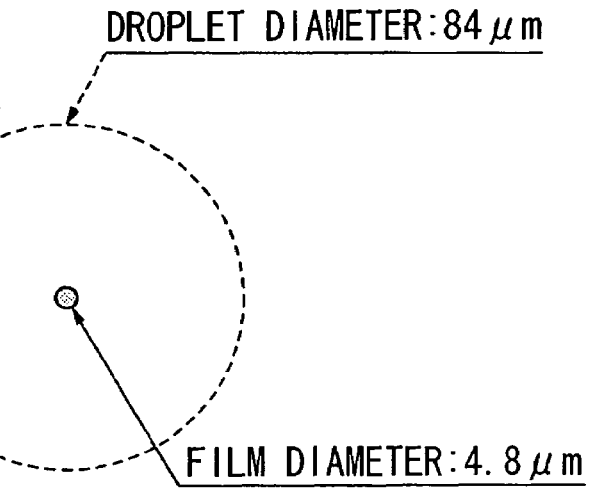
<Si SUBSTRATE>
<GLASS SUBSTRATE>
FIG. 11A
FIG. 11B
FIG. 11C
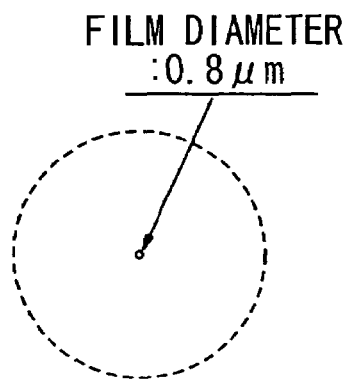
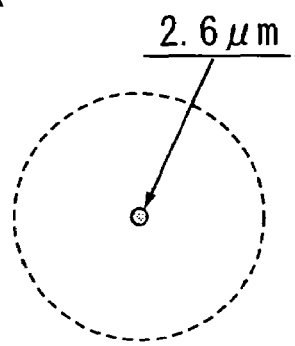
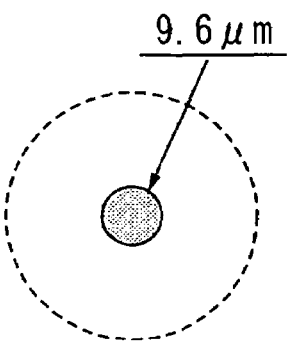

FIG. 12
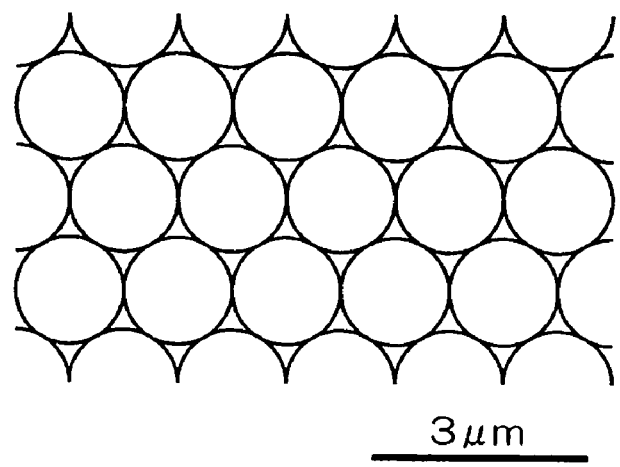
3μm
FIG. 13A      FIG. 13B      FIG. 13C
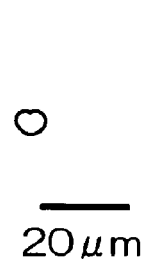   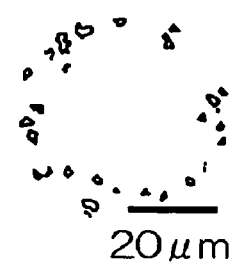   
20μm          20μm          20μm FIG. 14
| | DRYING SPEED | |
|---|---|---|
| | HIGH | LOW |
| CONCENTRATION OF SOLIDS — HIGH |  PINNING |  PINNING |
| CONCENTRATION OF SOLIDS — LOW |  PINNING |  DEPINNING |

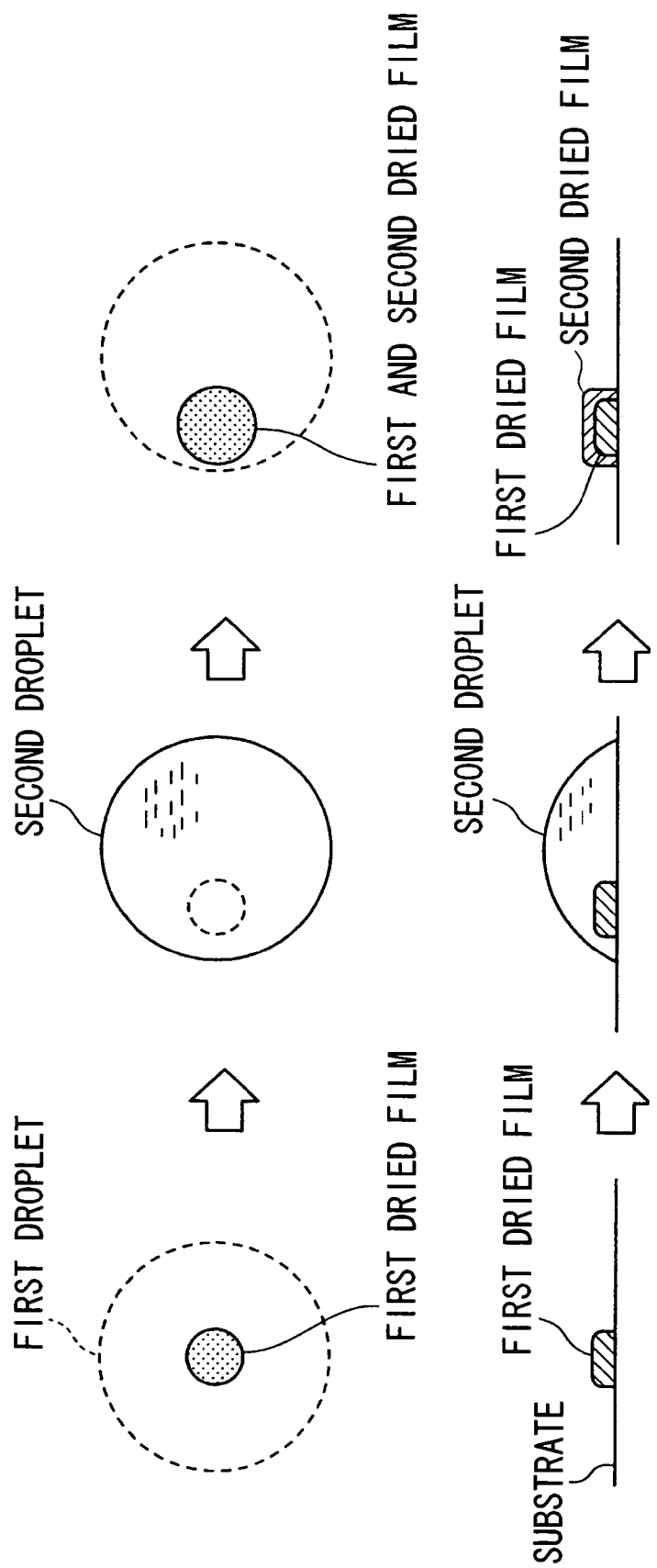

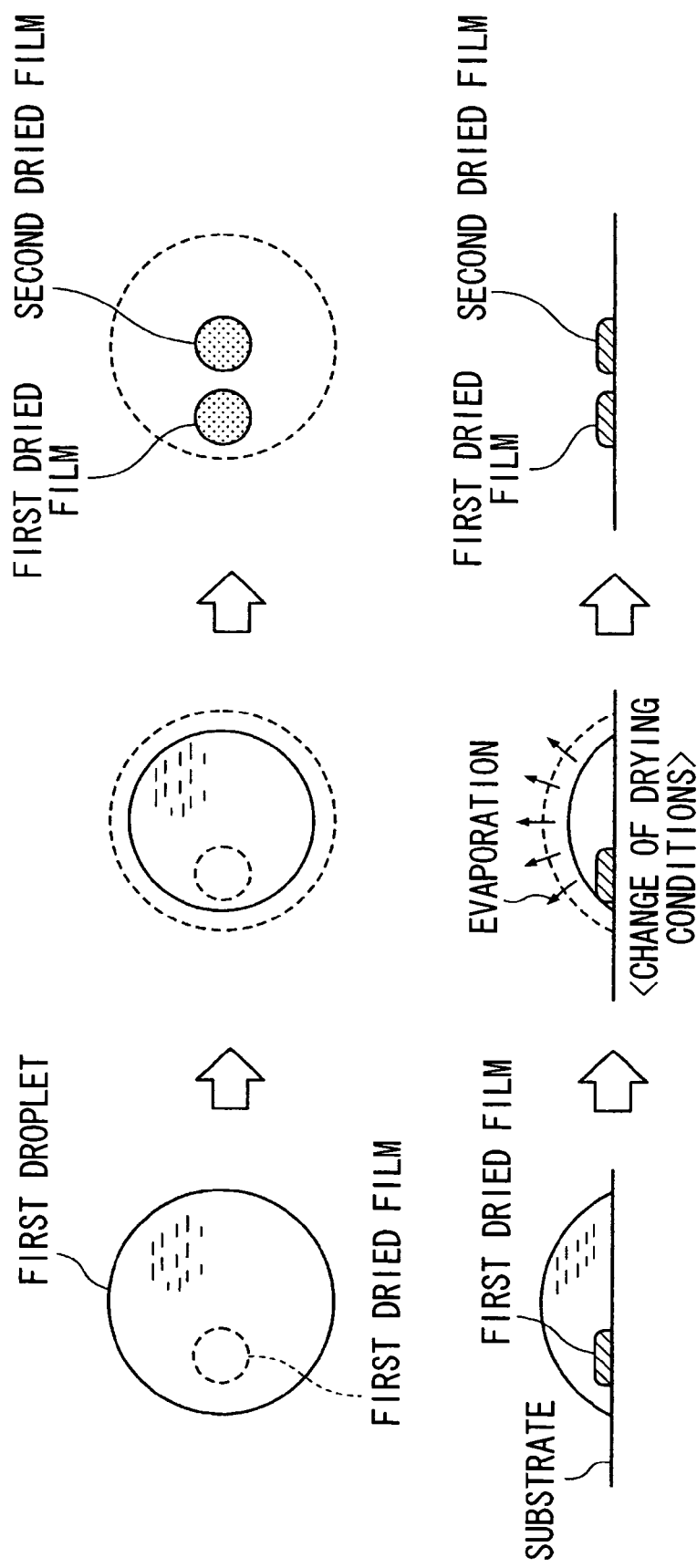

PROCESS FOR FORMING A FILM, PROCESS FOR MANUFACTURING A DEVICE, ELECTRO-OPTICAL DEVICE AND ELECTRONIC EQUIPMENT

PRIORITY CLAIM

Priority is claimed on Japanese Patent Application Nos. 2003-195824, 2003-195825, and 2003-195828, filed Jul. 11, 2003, the content of which is incorporated herein by reference.

BACKGROUND OF THE INVENTION

1. Field of the Invention

The present invention relates to a process for forming film, a process for manufacturing a device, an electro-optical device, and electronic equipment.

2. Description of Related Art

Manufacturing processes of electro-optical devices used in displays, display light sources, or the like, and electronic devices such as semiconductor devices, contain a step for placing material on a substrate to form a film on the substrate. Quality and functionality are intimately associated with the technique for placing material and the technique for forming a film. Therefore the techniques are important to improving the performance of each of the above-described devices.

A technique for placing material on a substrate is a method of discharging liquid material as droplets via a nozzle provided in a discharge head (for example, Japanese Unexamined Patent Application, First Publication No. 11-274671). This droplet discharge method generates less waste in the consumption of liquid material, and more easily controls the amount and the location of liquid material placed on a substrate compared with techniques such as a spin coating method.

A technique for forming a film on a substrate using a droplet discharge method requires accuracy in placing liquid material on a substrate, and also requires an improvement in the accuracy and stability of the form of a film after the liquid film has dried.

Incidentally, regarding a technique for making liquid material into droplets to place it on a substrate, there is a technique whereby a bank is formed on a substrate, and droplets are placed in the region surrounded by the bank (Japanese Unexamined Patent Application, First Publication No. 11-271753, for example). In this technique, since the region where droplets are placed is defined by the bank, being a partition, the droplets (liquid material) are prevented from spreading while wet.

In recent years, progress has been made in regards to the high density of circuits comprising devices, so fine detail is required in the pattern. Furthermore, devices are required to be of low cost.

In a bank forming technique as mentioned above, a bank is formed by patterning using a printing method, or patterning by lithography. However, in the printing method, it is difficult to handle the fine detail of the pattern. Furthermore, in the lithography method, since part of the bank forming material is removed along with patterning, there is a lot of waste in the amount of material used.

A technique for forming a film on a substrate using a droplet discharge method requires accuracy of placing liquid material on a substrate, and also requires fine detail in a film and an improvement in film properties after the liquid film has dried.

SUMMARY OF THE INVENTION

The present invention takes the above-described conditions into consideration, with an object of providing a process for forming a film, which can form a film of a desired shape on a substrate accurately and stably.

Furthermore, another object of the present invention is to provide a process for manufacturing devices that enables the quality of devices to be improved, an electro-optical device, and electronic equipment.

A first process for forming a film of the present invention is a process for forming a film by placing a liquid material on a substrate as a droplet to form a film on the substrate, wherein at least either one of a concentration of solids in the liquid material and a drying rate of the droplet is used as a parameter to control a form of a dried film of said droplet.

The form of the dried film includes a film thickness distribution of the dried film of the droplets, and an outer diameter of the dried film of the droplets, for example.

According to this process for forming a film, by changing at least either one of the concentration of solids in the liquid material, and the drying rate of the droplets, it is possible to form a film of a desired shape on a substrate accurately and stably.

In this case, since the parameter determines a flow of liquid in the droplets when drying, the location where the solids are deposited and the amount of deposition are determined, and hence the form of the dried film of the droplets is controlled.

For example, by determining the parameter such that a concentration of solids at an edge of the droplet reaches a saturation concentration earlier than a concentration of solids of a central part of the droplets, contraction of the droplet during drying is restricted by the solids deposited at the edge, thus forming a dried film with almost the same diameter as the droplet immediately after landing.

Furthermore, by determining the parameter such that a concentration of solids in a whole of the droplet reaches a saturation concentration at substantially the same time, the droplet shrinks during evaporation, thus forming a dried film with a smaller diameter than the droplet immediately after landing.

In the above-described process for forming a film, the drying speed can be changed by controlling at least one of; a speed of moving a stage on which the substrate is mounted, a spacing between droplets placed on the substrate, and a contact angle between the surface of the substrate and the liquid material.

Furthermore, the present invention is a process for manufacturing a device comprising a film pattern formed on a substrate, wherein the film pattern is formed on the substrate using the above-described process for forming a film.

Using this process for manufacturing devices, a film of a desired shape is formed on a substrate accurately and stably, thus the quality of devices can be improved.

Moreover, an electro-optical device of the present invention is provided with a device manufactured using the above-described process for manufacturing a device.

Examples of such devices are semiconductor elements, image elements, liquid crystal display elements, organic electroluminescent elements, and the like.

Furthermore, examples of electro-optical devices are liquid crystal displays, organic electroluminescent display devices, plasma type display devices, and the like.

Moreover, electronic equipment of the present invention is provided with an electro-optical device as described above.

Using these aspects of the invention, quality can be improved.

Furthermore, the present invention takes the above conditions into consideration, with an object of providing a process for forming a film, which is capable of handling the formation of a fine detailed pattern and reduction of the amount of material used, and that can form a film at a desired location on a substrate stably.

Another object of the present invention is to provide a process for manufacturing devices that enables the quality of devices to be improved, an electro-optical device, and electronic equipment.

A second process for forming a film of the present invention has: a step for placing a first droplet on a substrate; a step for drying the first droplet to form a dried film of a form in which a thickness of an edge is larger than a thickness of a central part; and a step for placing a second droplet in a region surrounded by an edge section of a dried film of the first droplet to form a dried film of the second droplet.

Using this process for forming a film, the second droplet is placed in the region surrounded by the edge section of the dried film of the first droplet, and at this time the edge section of the dried film of the first droplet serves as a partition. Hence the second droplet is placed in a desired location accurately, and also the second droplet is prevented from spreading while wet. Furthermore, in this process for forming a film, since part (the edge section) of the dried film of the first droplet is used as a partition, it is suitable to be used for forming a fine detailed pattern. Moreover, when forming a partition, since the material of the first droplet does not need to be removed, the amount of material used can be reduced.

In the second process for forming a film, the form of the dried film of the first droplet can be controlled by the drying conditions for the first droplet.

For example, it is preferable to determine the drying conditions for the first droplet such that a concentration of solids at an edge of the first droplet reaches a saturation concentration earlier than at a central part. Here, the droplet dries more quickly at the edge, so the liquid flows easily toward the edge of the droplet. If the concentration of solids at the edge of the droplet reaches the saturation concentration earlier than at the central part, the solids are deposited locally at the edge. As a result, the edge of the droplet is fixed by the solids deposited, and hence contraction of the droplet during drying afterwards is restricted. When contraction of the droplet is restricted, a flow to compensate for the liquid lost by evaporation at the edge of the droplet from the central part, that is a flow of liquid from the central part toward the edge, is formed in the droplet, and a lot of solids is carried to the edge of the droplet by the flow. As a result, the thickness of the edge of the dried film of the first droplet is greater than that of the central part, for example. That is, by determining the drying conditions for the first droplet, it is possible to form a dried film having an edge section suitable for the above-mentioned partition.

Furthermore, in the second process for forming a film, the drying conditions for the first droplet include the concentration of solids in the first droplet, and a speed of drying of the first droplet. Hence it is possible to control the desired shape of the dried film.

In this case, the device for determining the drying speed may control at least one of, a moving speed of a stage on which the substrate is mounted, a spacing between the droplets placed on the substrate, a timing of arranging or placing the droplets, and a contact angle between a surface of the substrate and the liquid material, for example.

Moreover, the second process for forming a film may have a step for making a boundary of a region where the first droplet is placed on the substrate liquid repellent with respect to the first droplet.

Here, liquid repellent means characteristics indicating incompatibility with the first droplet. In this case, the region where the first droplet is placed is defined by the liquid repellent boundary region, and the accuracy of location of the first droplet can be improved.

In this case, the boundary region may be made liquid repellent using self-assembled monolayers for example. Here, self-assembled monolayers (SAMs) are films produced by a self-assembly (SA) method, which is a method for fixing molecules on a solid surface, and a method whereby a high orientation and high density molecular layer can be formed. The self-assembly method can manipulate the environmental and geometrical arrangement of a molecule to the order of Angstroms. Furthermore, self-assembled monolayers are valuable as a technique for fixing organic molecules, the method of manufacturing them is simple, and their thermal stability is high due to the chemical bond between molecules and substrate. Therefore it is an important technology for manufacturing molecular devices of the order of Angstroms. Moreover, self-assembled monolayers use a self assembly process, basically, and can form a fine detailed pattern automatically. That is, self-assembled monolayers can form a detailed, high standard pattern such as is used in an ultra fine electronic circuit, that is, for which existing lithographic methods cannot be used. Accordingly, in the above-described process for forming a film, by defining a region in which a first droplet is placed using self-assembled layers, it is possible to improve the accuracy of the location of the first droplet. As a result, it is possible to form a dried film of a second droplet in a desired location accurately.

Furthermore, in the process for forming a film, the first droplet may be placed singly on the substrate, or may be placed with a plurality combined on the substrate. In the case where the first droplet is placed singly, by a dried film of the first droplet being formed in an almost circular shape for example, an almost circular shaped region is defined as a region where a second droplet is placed. Moreover, in the case where a combined plurality of first droplets is placed, by a dried film of the combined first droplets being formed in an almost rectangular shape for example, an almost rectangular region is defined as a region where the second droplets are placed. That is, by combining a plurality of droplets as the first droplets, the region where the second droplets are placed can be varied in a range of shapes. As a result, it is possible to form a range of shapes of a dried film of the second droplets.

Furthermore, in the process for forming a film, a multilayer film comprising the dried film of the first droplet and the dried film of the second droplet is used to form any one of; a wiring layout, a color filter, a photoresist, a micro lens array, an electroluminescent material, a conductive high molecular material, and a biological material, for example.

Moreover, the present invention is a process for manufacturing a device comprising a film pattern formed on a substrate, wherein the film pattern is formed on the substrate using the above-described process for forming a film.

Using this process for manufacturing devices, a film is formed at a desired location on a substrate stably, thus enabling the quality of devices to be improved.

Furthermore, an electro-optical device of the present invention is provided with a device manufactured using the above-described process for manufacturing a device.

Examples of such devices are semiconductor elements, image elements, liquid crystal display elements, organic electroluminescent elements, and the like.

Moreover, examples of electro-optical devices are liquid crystal displays, organic electroluminescent display devices, plasma type display devices, and the like.

Furthermore, electronic equipment of the present invention is provided with an electro-optical device as described above.

Using these aspects of the invention, quality can be improved.

The present invention takes the above-described conditions into consideration, with an object of providing a process for forming a film that is suitable for achieving fine detail and improving film properties.

Another object of the present invention is to provide; a process for manufacturing devices that enables the quality of devices to be improved, an electro-optical device, and electronic equipment.

A third process for forming a film of the present invention is a process for placing liquid material on a substrate as a droplet to form a film on the substrate, wherein a dried film of the droplet is formed by contracting the droplet.

The diameter of the dried film of the droplet is smaller than the diameter of the droplet immediately after being placed on the substrate.

According to this process for forming a film, by contracting the droplet during drying, it is possible to form a film with a range of characteristics. For example, it is possible to form an extremely small film on a substrate by using the contraction of a droplet.

Furthermore, in a case where a droplet is placed on a substrate using a droplet discharge method, there is a lower limit to the volume of droplet capable of being discharged. However, by using this process for forming a film, it is possible, easily, to form film that is much smaller than the droplet immediately after landing.

In the process for forming a film, it is possible to contract a droplet accurately by determining the drying conditions for the droplet such that solids are not deposited at the edge of the droplet during an initial stage of drying.

Moreover, in the third process for forming a film, by determining the drying conditions for the droplet such that a concentration of solids of the liquid material reaches a saturation concentration throughout the droplet at substantially the same time, it is possible to further contract the droplet.

Furthermore, in the third process for forming a film, the drying conditions for the droplet include the concentration of solids in the liquid material, and the speed of drying of the droplet. Hence, it is possible to control the form and physical properties of the dried film of the droplet.

In this case, a device for determining the drying speed may control at least one of; a moving speed of a stage on which the substrate is mounted, a spacing between droplets placed on the substrate, a timing of arranging or placing the droplets, and a contact angle between a surface of the substrate and the liquid material.

Moreover, in the third process for forming a film, the liquid material may contain fine particles, being solids, and a salt concentration may be adjusted according to a surface potential of the fine particles.

In this case, fine particles are arranged densely throughout the liquid by repulsion between the fine particles contained in the liquid material. During the process of droplet contraction, deposition of solids is restricted, and it is difficult for the structure of the arrangement of the fine particles to be broken. As a result, in this process for forming a film, it is possible to form a film with a dense structure.

Furthermore, in the third process for forming a film, it is also possible to form a crystalline thin film as the aforementioned dried film.

Moreover, the third process for forming a film may have; a step for placing a first droplet of the liquid material on the substrate to form a dried film of the first droplet, and a step for placing a second droplet of the liquid material on the substrate overlapping a part of the dried film of the first droplet, to form a dried film of the second droplet.

By drying the first droplet placed on the substrate at first, then placing the succeeding second droplet overlapping the dried film of the first droplet, it is possible to form a plurality of dried films close and alongside each other. As a result, it is possible to form a range of film patterns such as a line shaped film pattern and the like. Furthermore, in this process for forming a film, high definition of these film patterns can be achieved.

In this case, the dried film of the first droplet and the dried film of the second droplet may have different drying conditions.

As a result, the drying conditions of each of the first and second droplets can be optimized. That is, since the second droplet is placed on the dried film of the first droplet partially overlapping, the conditions of placing it on the substrate are different from those of the first droplet. Therefore, the drying conditions of both droplets are made different from each other, so that it is possible to contract both droplets optimally.

In this case, for example after the second droplet starts to contract, the drying conditions for the second droplet may be changed. That is, by making the drying conditions of the first droplet and the second droplet during the initial drying stage the same, it is possible to start the contraction of the first and second droplets in the same state. Afterward, by changing the drying conditions of the second droplet according to the difference in placement conditions, it is possible for the first droplet and the second droplet to form dried films with the same form, for example.

Furthermore, the present invention is a process for manufacturing a device comprising a film pattern formed on a substrate, wherein the film pattern is formed on the substrate using the above-described process for forming a film.

Using this process for manufacturing devices, it is possible to form a highly detailed film pattern using the process for forming a film, thus enabling the quality of devices to be improved.

Moreover, an electro-optical device of the present invention is provided with a device manufactured using the above-described process for manufacturing a device.

Examples of devices are semiconductor elements, image elements, liquid crystal display elements, organic electroluminescent elements, and the like.

Furthermore, examples of electro-optical devices are liquid crystal displays, organic electroluminescent display devices, plasma type display devices, and the like.

Moreover, electronic equipment of the present invention is provided with an electro-optical device as described above.

Using these aspects of the invention, quality can be improved.

BRIEF DESCRIPTION OF THE DRAWINGS

FIG. 2 shows examples in which a plurality of droplets is placed on a substrate.

FIGS. 10A and 10B show how dried films are formed on a substrate using silica slurry.

FIGS. 11A, 11B and 11C show the change in the form of a depinned thin film when the concentration of solids in a liquid material is changed.

FIG. 12 shows, schematically, an observed image of the structure of a depinned thin film.

FIGS. 13A, 13B and 13C show the change of a film structure in the case where the drying conditions are changed for the purpose of forming a crystalline thin film.

FIG. 14 shows, schematically, the relationship between parameters (concentration of solids in a liquid material and drying speed of a droplet), and the form of a dried film.

FIG. 25 is a diagram to explain a problem when forming depinned thin films close together.

FIG. 26 a diagram to explain a process for forming depinned thin films close to and alongside of each other.

DETAILED DESCRIPTION OF THE INVENTION

Hereunder is a detailed description of the present invention.

Figure 1:
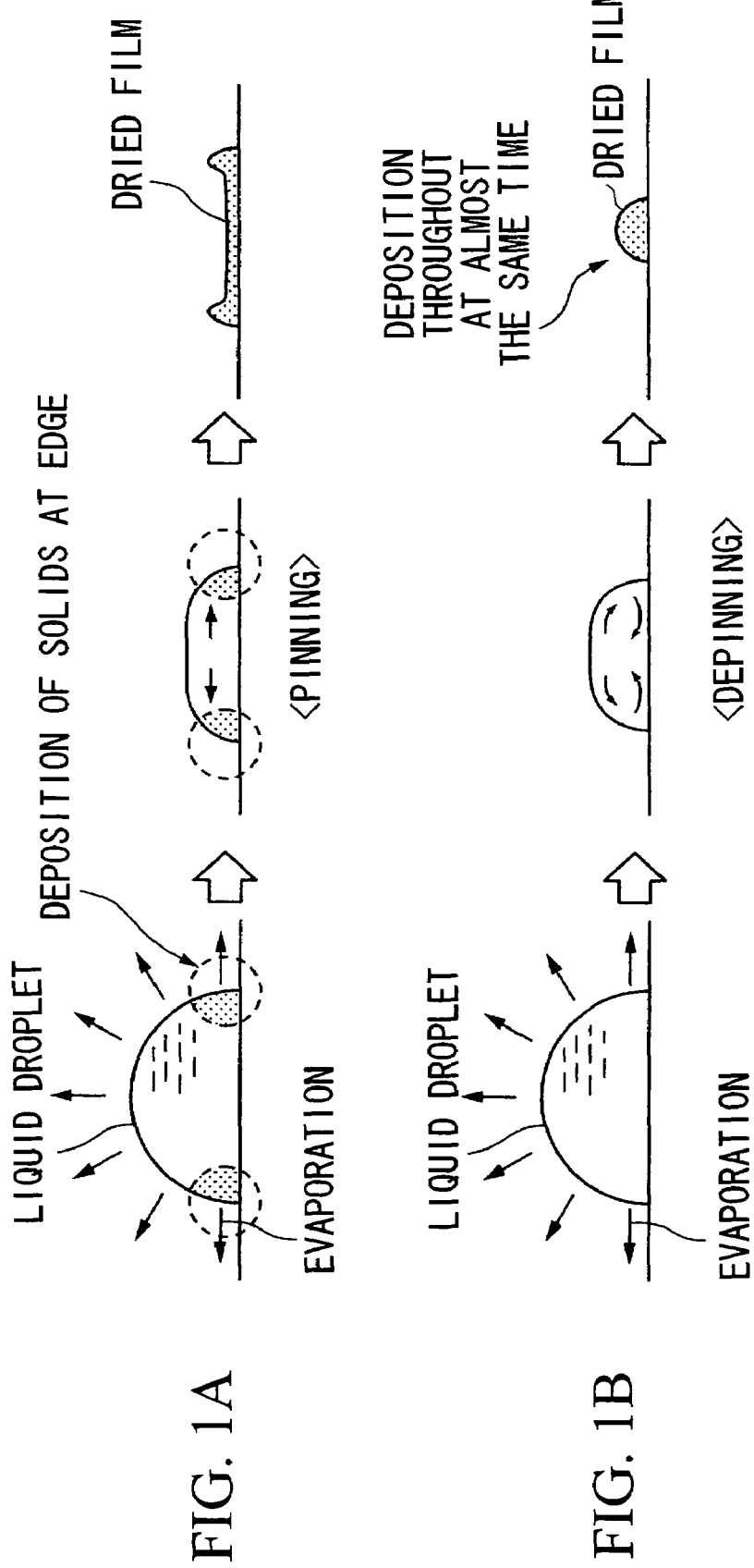
FIGS. 1A and 1B show, schematically, typical processes for drying droplets in a first process for forming a film of the present invention.

FIGS. 1A and 1B show, schematically, typical processes for drying droplets in a first process for forming a film of the present invention.

In the first process for forming a film of the present invention, liquid material is placed on a substrate as droplets, and then dried to form a dried film of the droplets on the substrate. Here is a description of the case where one droplet is placed on the substrate. However, the present invention is not limited to this, and it also includes the case where a plurality of droplets is placed on the substrate and dried, for example. Furthermore, as described later, by placing dried films of a plurality of adjoining droplets continuously, it is also possible to form a linear shaped film pattern on the substrate.

In the first process for forming a film of the present invention, by controlling the drying process using at least either one of; the concentration of solids in a liquid material, and the drying speed of a droplet as a parameter, a dried film of the droplet is controlled in a range of forms. To be specific, as shown in FIG. 1A, a dried film of a droplet is formed such that the film is thicker at the edge than at the central part, or as shown in FIG. 1B, it is formed to be contracted compared with the droplet after landing, for example.

In the drying process as shown in FIG. 1A, the above-described parameter (concentration of solids in liquid material, drying speed of droplet) is determined such that the concentration of solids at the edge of a droplet reaches the saturation concentration earlier than that at the central part does. In general, a droplet placed on a substrate dries faster at its edge. In a drying process of a droplet, when the concentration of solids at the edge of the droplet reaches the saturation concentration, the solids are deposited locally at the edge. Then, the edge of the droplet is in a state of being fixed as though by a pin by the solids deposited, thus restricting the contraction (contraction of the outer diameter) of the droplet during subsequent drying. Hereunder, this phenomenon, that is, the phenomenon whereby the contraction of a droplet during drying is restricted by solids deposited at its edge is termed "pinning".

On the other hand, in the drying process as shown in FIG. 1B, the above-described parameter (concentration of solids in liquid material, drying speed of droplet) is determined such that the concentration of solids throughout a droplet reaches the saturation concentration at almost the same time. In this case, since it is difficult for the local solids at its edge to be deposited, the abovementioned pinning does not occur, and the droplet contracts by evaporation during the drying process. That is, the outer diameter of the droplet becomes smaller as the drying proceeds. Hereunder, this phenomenon, that is the phenomenon whereby a droplet contracts without pinning when drying, is termed "depinning". The flows of liquid in the droplets shown in FIGS. 1A and 1B are examples, and may be different from the actual flow.

Here, the drying speed of the droplet associated with the above-described parameter changes according to; the moving speed of a stage on which a substrate is mounted, the spacing between droplets (distance between droplets) placed on the substrate, the arrangement of a plurality of droplets and timing of placement, and the contact angle between the surface of the substrate and the liquid material.

For example, when the stage moves, the vapor phase moisture concentration near the droplet falls, and hence the drying of the droplet is accelerated. The greater the moving speed of the stage, the greater the relative moving speed of the droplet through the atmosphere, and hence the drying speed of the droplet increases.

FIG. 2 is a diagram showing an example in which a plurality (two here) of droplets is placed on a substrate.

As shown in FIG. 2, when the droplets dry, liquid changing from the liquid phase to the vapor phase evaporates, diffusing three dimensionally from the droplet in the center. A "vapor diffusion layer" is the region where molecules evaporated from a droplet form a concentration gradient in the vapor phase near the droplet due to the movement by diffusion. Here, a vapor layer, which is formed in the vapor phase near the surface of the droplet, and has a concentration that has an influence on other droplets, is also included in the vapor diffusion layer in a broad sense. Furthermore, the distance between droplets is defined as the distance between the centers of adjacent droplets. In addition, the thickness of the vapor diffusion layer changes according to the physical properties of the liquid material, the concentration of solids, the environmental temperature, and the like.

When a plurality of droplets is placed on a substrate, if there is a droplet inside the vapor diffusion layer of another droplet, or the vapor diffusion layers of adjacent droplets overlap partially, the evaporation speed of the droplet changes due to the change in vapor concentration on the surface of the droplet or the like. To be specific, the shorter the distance between droplets, and the further the distance their vapor diffusion layers overlap, the shorter the evaporation speed (drying speed) of the droplets, and the longer the drying time. On the other hand, in the case where the vapor diffusion layers do not overlap, even if the distance between the droplets changes, the evaporation speed and drying time of the droplets hardly change. Accordingly, within a range where the vapor diffusion layer has an influence, it is possible to change the drying speed of the droplets by changing the distance between droplets.

Furthermore, in the case where a plurality of droplets is placed on a substrate, the drying time of the droplets changes not only due to the above-described distance between the droplets, but also the timing, their number, arrangement, and the like. For example, depending on the period from when a droplet is placed on a substrate to when the next droplet is placed, the drying (evaporation) state of the first droplet changes when the next droplet is placed. Therefore, depending on the change, the amount of influence of the vapor diffusion layers between the droplets and the drying speed of the droplets change. That is, the longer the above-described period, the less the influence of the vapor diffusion layers between the droplets, and hence the drying speed of the droplets increases.

Figure 3A:
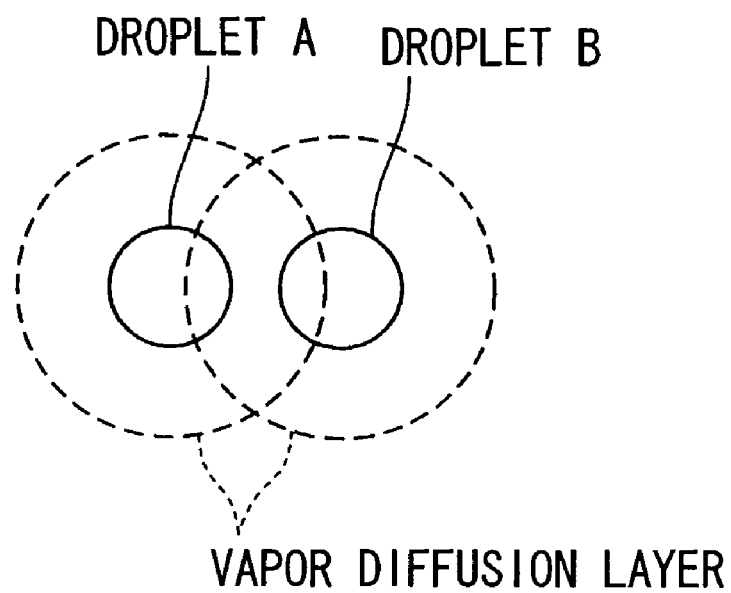
FIGS. 3A and 3B show an example of placing a plurality of droplets.
Figure 3B:
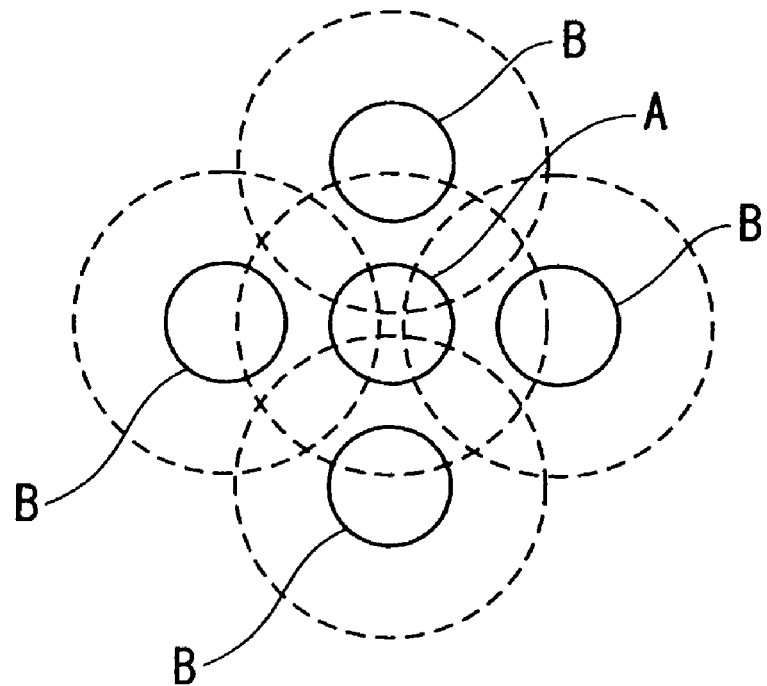

Moreover, as shown in FIGS. 3A and 3B, within the range where vapor diffusion layers overlap, the greater the number of droplets B placed adjacent to a droplet A and the greater the influence of the vapor diffusion layers, the lower the drying speed of the droplet A. Furthermore, in the case where a droplet B is placed on one side of a droplet A (FIG. 3A) within the range where their vapor diffusion layers overlap, the drying speed on the side of droplet A on which droplet B is placed becomes fractionally lower. In this case, since a fractional deviation occurs in the drying speed, the form of the dried film of the droplet A becomes anisotropic. Conversely, in the case where a plurality of droplets B is placed all around one droplet A (FIG. 3B), it is difficult for a fractional deviation of the drying speed to occur, and hence the form of the dried film of droplet A becomes isotropic.

Figure 4A:
FIGS. 4A and 4B show droplets in the case where the contact angles (static contact angles) between the surfaces of the substrates and the liquid material are different.
Figure 4B:

FIGS. 4A and 4B show droplets where the contact angles (static contact angle) between the surfaces of the substrates and the liquid material are different (contact angle θa<θb).

When an identical volume of droplets is placed on the substrate, the smaller the contact angle, the larger the outer diameter of the droplet is. Since there is a tendency that the larger the outer diameter of the droplet, the faster the drying speed becomes, the smaller the contact angle between the surface of the substrate and the liquid material, the faster the drying speed becomes. The contact angle is made smaller by applying lyophilic treatment to the surface of the substrate, and is made larger by applying liquid repellent treatment to the surface of the substrate, for example.

From the above, it is possible to change the drying speed of a droplet by controlling; the moving speed of a stage on which a substrate is mounted, the spacing between droplets (distance between droplets) placed on the substrate, the arrangement of a plurality of droplets or timing of placement, and the contact angle between the surface of the substrate and the liquid material. In addition, methods of changing the drying speed of a droplet other than the above may also be used, by controlling environmental factors such as temperature, humidity, air pressure, and the like, or using a heating device or an air circulation device. These control methods may be used in combination as required.

Figure 5:
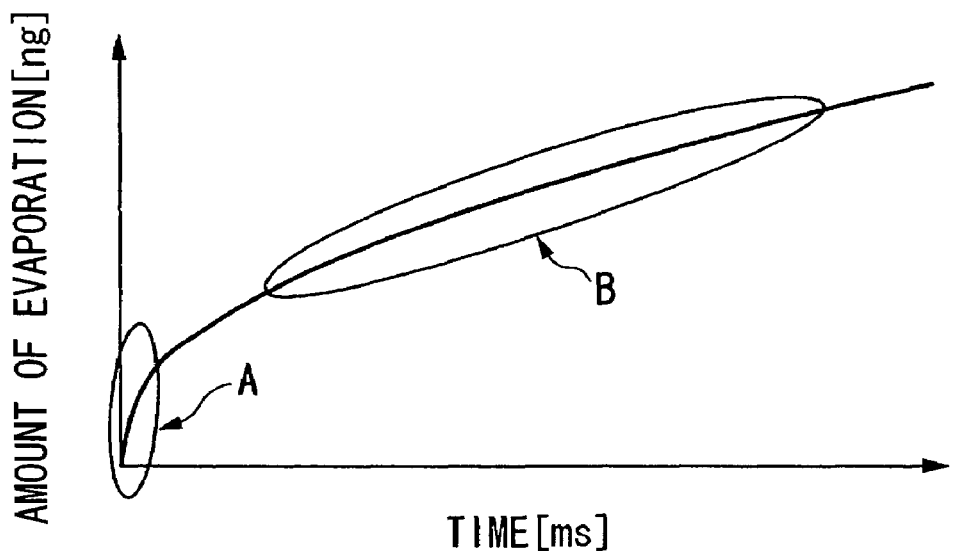
FIG. 5 shows the time integration of the amount of evaporation of liquid (solvent, dispersion medium, or the like) from a droplet under fixed drying conditions.

FIG. 5 is a diagram showing the time integration of the amount of evaporation of liquid (solvent, dispersion medium or the like) from a droplet under fixed drying conditions.

As shown in FIG. 5, during the initial stage of drying, the amount of evaporation with time is high (region A shown in FIG. 5). This is because during the initial drying period immediately after the droplet is placed on a substrate, the vapor concentration near the droplet is low, and the drying speed (evaporation speed) of the droplet is high. Afterwards, when the area around the droplet (mean free path distance of liquid molecules) reaches the saturation concentration, the drying speed of the droplet becomes constant (region B as shown in FIG. 5), where it is controlled by the vapor diffusion rate.

As described previously, a droplet placed on a substrate dries faster at its edge. Therefore, during the initial stage of drying (region A as shown in FIG. 5), there is a tendency for liquid to evaporate quickly at the edge of the droplet, and for the concentration of solids to increase. At this time, when the concentration of the solids at the edge of the droplet reaches the saturation concentration, the above-described pinning occurs.

[Pinning]

Figure 6:
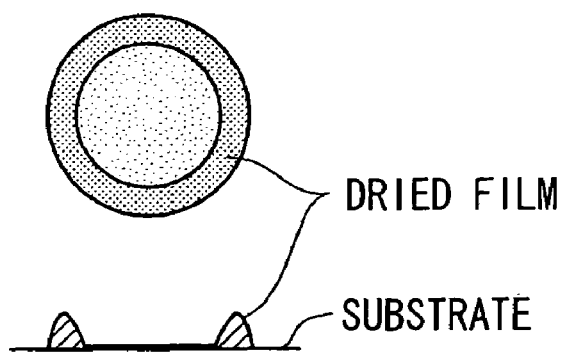
FIG. 6 shows a form of a pinned thin film: plan view at the top, and cross sectional view underneath.
Figure 7:
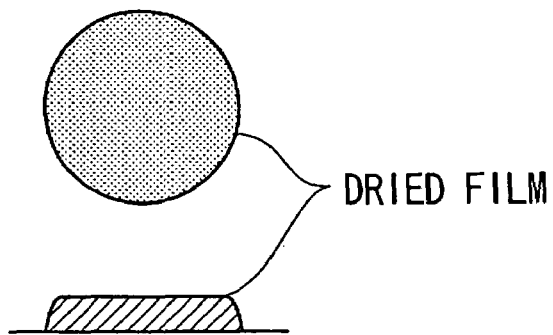
FIG. 7 shows another form of a pinned thin film: plan view at the top, and cross sectional view underneath.
Figure 8:
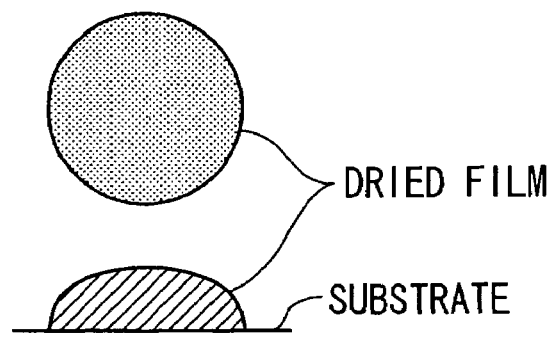
FIG. 8 shows another form of a pinned thin film: plan view at the top, and cross sectional view underneath.

FIG. 6 to FIG. 8 each show forms of dried films (pinned thin films) formed through pinning: plan views at the top, and cross sectional views underneath.

As described previously, pinning is a phenomenon whereby the contraction of a droplet during drying is restricted by solids deposited at its edge. When pinning occurs in a droplet, a flow from the central part to compensate for liquid lost by evaporation at the edge of the droplet, that is a flow of liquid from the central part toward the edge, is formed as shown previously in FIG. 1A. This flow of liquid changes according to the above-described parameter. The dried films as shown in FIG. 6 to FIG. 8 have different parameters in their drying processes.

The dried film as shown in FIG. 6 is formed by determining the parameter such that a strong flow of liquid from the central part of the droplet toward the edge is formed when drying. As shown in FIG. 1A, after pinning occurs, if a strong flow of liquid forms from the central part toward the edge, a lot of solids is carried to the edge of the droplet as this liquid flows. At the edge of the droplet, the flow of liquid stagnates easily by a rise in the viscosity or the like as the solids are deposited, and a high concentration of solids is maintained. That is, the flow of liquid from the edge toward the central part is weaker than the flow of liquid from the central part toward the edge. As a result, a lot of solids is deposited at the edge of the droplet, and hence the film at the edge section of the dried film becomes thick.

In this case, the lower the parameter of the concentration of solids in the liquid material, and the greater the drying speed, the stronger the flow of liquid from the central part toward the edge. Accordingly, by decreasing the concentration of solids in the liquid material, or increasing the drying speed, it is possible to increase the ratio of the thickness of the edge to the central part of the dried film. That is, a dried film with a thick edge is formed. Furthermore, in the case where the solids are fine particles, the smaller the size of the fine particles, the easier it is for the solids to be carried to the edge along with the flow of liquid, and hence the film at the central part of the dried film becomes thin easily. By having a high ratio of the thickness of the edge to the central part of the dried film, a ring shaped dried film is formed as shown in FIG. 6 for example.

The dried film shown in FIG. 7 has the above-described parameter determined such that the flow of liquid from the central part toward the edge is weak. The higher the parameter of the concentration of solids in the liquid material, or the lower the drying speed, the weaker the flow of liquid from the central part toward the edge, and hence it is more difficult for solids to be carried toward the edge of the droplet. Furthermore, in the case where the solids are fine particles, the larger the size of the fine particles, the more difficult it is for the solids to be carried from the central part of the droplet to the edge. Hence it is more difficult for the film at the central part of the dried film to be thinned. As a result, as shown in FIG. 7, a dried film with an almost flat cross section is formed with similar thicknesses at the central part and at the edge.

The dried film shown in FIG. 8 has the above-described parameter determined such that the flow of liquid from the central part of a droplet toward the edge is weaker than in FIG. 7. The dried film shown in FIG. 8 has a higher concentration of solids in the liquid material, a lower drying speed and a larger size of fine particles, being solids, than the dried films shown in FIG. 6 and FIG. 7. In this case, it is difficult to carry the solids from the central part of the droplet toward the edge, and as shown in FIG. 8, the film at the central part of the dried film is thicker than that at the edge.

In this manner, under the conditions in which pinning occurs, in the case of the above-described parameter (concentration of solids in liquid material, drying speed of a droplet), or where the solids are fine particles, by changing the size of the fine particles, it is possible for a dried film of the droplet to be produced in a range of shapes.

Furthermore, regarding a dried film with a thick ring shaped film at its edge, by changing the above-described parameter and the size of the fine particles, it is possible to control the width or the like of the elevated part at the edge. To be specific, the higher the concentration and the larger the size of the fine particles, the lower the influence of the flow of liquid from the center. Hence there is a tendency for the shape of the film to be closer to flat, and the elevated part of the edge to get narrower.

Figure 9A:
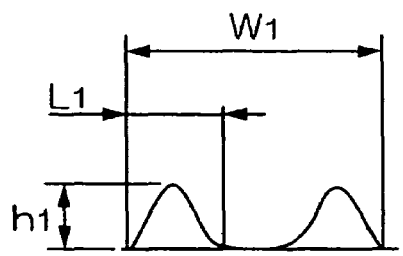
FIGS. 9A and 9B relate to dried films formed via pinning, in particular ring shaped films, which show changes in the shapes of the films when the concentration of solids in a liquid material, and the size of the fine particles, are changed.
Figure 9B:
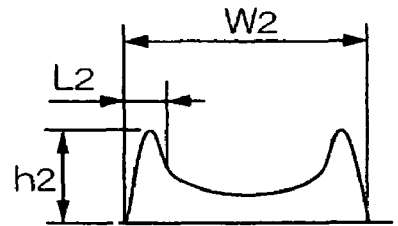

FIGS. 9A and 9B relate to dried films formed through pinning, in particular ring shaped films, which show the change of the shapes of the films in the case where the concentration of solids in a liquid material, and the size of the fine particles, are changed.

Here, for the size of the fine particles: FIG. 9A<FIG. 9B, and for the concentration of the solids in the liquid material: FIG. 9A<FIG. 9B.

The outer diameter of the dried film of FIG. 9A is $W_1$, the thickness of its edge is $h_1$, the width of the elevated part is $L_1$, the outer diameter of the dried film of FIG. 9B is $W_2$, the thickness of its edge is $h_2$, the width of the elevated part is $L_2$, and $W_1<W_2, h_1<h_2, L_1>L_2$.

In addition, another droplet may be placed overlapping the droplet during drying through pinning.

In this case, by increasing the liquid in the drying droplet, the flow of liquid from the center toward the edge is maintained, and hence more solids are carried toward the edge. This accelerates the movement of solids toward the edge, so the film at the edge is easily made thicker. Furthermore, the affinity of the substrate surface with the liquid material may be controlled, and the boundary section where the affinity changes may induce pinning. Moreover, by heating the liquid material placed on the substrate, or using a solvent with a low boiling point as a liquid material, the change in the shape of the film due to the parameter becomes more noticeable.

[Depinning]

On the other hand, to prevent pinning in order to induce depinning, by reducing the drying speed of the droplet, or reducing the concentration of solids in the liquid material, solids may be prevented from being deposited at the edge, especially during the initial stage of drying.

As shown in FIG. 1B, in the drying process via depinning, the droplet contracts while evaporating (for example, contraction ratio: ½ or less). In the process of a droplet contracting, convection currents in the droplet, comprising the flow of liquid from the central part toward the edge, and the flow from the edge toward the central part, are formed continuously, the concentration of local solids in the droplet is prevented from increasing, and the concentration of solids in the droplet is made even. Then, by the concentration of solids throughout the droplet reaching the saturation concentration, deposition occurs throughout the droplet at almost the same time. In this case, solidification occurs while the shape of the droplet is maintained during the process of the droplet contracting, and the dried film (depinned thin film) has almost the same thickness at the central part and at the edge, or the film at the central part is thicker than that at the edge.

In film formation by depinnning, since the droplet contracts during the drying process, it is possible to form an extremely small film on the substrate. Further to this, by utilizing the contraction of a droplet in the drying process, it is possible to form a film having a range of characteristics, such as forming a film with a dense structure (colloidal crystal or the like), forming a crystal thin film, and the like.

[Very Small Film]

The size (outer diameter) of a depinned thin film can be controlled by adjusting the concentration of solids in a liquid material. To be specific, for a prescribed volume of droplet, the higher the concentration of solids in the liquid material, the larger the size of the dried film. Conversely, by keeping the concentration of solids in the liquid material low, it is possible to form an extremely small thin film. In this case, even in the case where the volume of a droplet capable of being placed on a substrate has a lower limit, by adjusting the concentration of solids in the liquid material, it is possible to increase the droplet contraction ratio in the drying process, and form an extremely small dried film on the substrate.

FIG. 10 shows how a dried film is formed on a substrate using a liquid material (silica slurry) containing fine particles of silica.

Here, the concentration of solids in the liquid material is 0.01 wt %, the volume of droplets (before drying) is 9 pl (picoliters), and the moving speed of the substrate stage is 500 µin/s. Furthermore, as a substrate on which the droplet is placed, an Si substrate (contact angle: 50°) is used in FIG. 10A, and a glass substrate (contact angle: 9°) in FIG. 10B.

As a result, depinning occurs in the drying process of the droplet, and the dried film is contracted in comparison with the droplet immediately after being placed. Moreover, on the Si substrate (FIG. 10A), the diameter of the droplet on landing is 45 μm, whereas the diameter of the dried film is 3.0 μm. On the glass substrate (FIG. 10B), the diameter of the droplet on landing is 84 μm, whereas the diameter of the dried film is 4.8 μm.

That is, on the Si substrate, the diameter of the dried film is about 1/15 (contraction ratio) compared with the droplet immediately after being placed, and on the glass substrate, about 1/17.5. In addition, when the diameter of a droplet of silica slurry of 0.01 wt % and 9 pl is 3 μm, the concentration of solids of the droplet at the time is 50 wt %. This value is almost the same as the value in a reference that states that silica slurry solidifies at a filling rate of 0.5 to 0.6. That is, when a droplet of silica slurry contracts to 3.0 μm in diameter, the whole of the droplet is considered to reach the saturation concentration at almost the same time.

Furthermore, in the present example, depinning occurred not only on a liquid repellent substrate with a high contact angle (Si substrate: contact angle 50°), but also on a lyophilic substrate with a low contact angle (glass substrate: contact angle 9°). That is, regardless of the affinity of a substrate surface with a liquid material, it was possible to produce depinning by keeping the drying speed of the droplet low.

FIGS. 11A to 11C show the change in the form of a dried film (depinned thin film) with depinning when the concentration of solids in a liquid material is changed.

In FIGS. 11A to 11C, the volumes of the droplets placed on a substrate are all the same. The concentrations of solids in the liquid material are FIG. 11A<FIG. 11B<FIG. 11C, so FIG. 11A is the lowest.

At this time, the diameter of the depinned thin film was 0.8 μm in FIG. 11A, 2.6 μm in FIG. 11B, and 9.6 μm in FIG. 11C. That is, the diameter of the dried film changed according to the concentration of solids. In the present example, in FIG. 11A where the concentration of solids in the liquid material was the lowest, an extremely small dried film with a diameter of 0.8 μm was formed.

[Colloid Crystal Film]

In film formation through depinning, since solids at the stage of a contracting droplet are prevented from being deposited, it is possible to obtain a characteristic film structure. For example, in the case where a liquid material containing fine particles (colloid particles) is used, by adjusting the concentration of salts in the liquid phase (dispersion medium) according to the surface potential of the fine particles, it is possible to form a dried film with a dense structure.

That is, in the case where the fine particles carry an electric charge in the liquid phase, an electric double layer is formed around the fine particles by electrostatic interaction between ions. If the salt concentration in the liquid phase containing colloid particles is set to an appropriate value to keep the size of the electric double layer on the surface of the particles appropriate, the particle arrangement becomes a close-packed structure (closest packed structure), and hence a colloid crystal is produced from the liquid phase. In film formation through depinning, since solids are prevented from being deposited in the process of a droplet contracting, it is difficult for the structural arrangement of fine particles in the liquid to be broken. As a result, a film having a dense structure (close-packed structure) is formed.

FIG. 12 shows, schematically, an observed image of the structure of a depinned thin film.

Here, a dried film of a droplet was produced using a liquid material containing fine polystyrene particles. Furthermore, the concentration of salts in the liquid material was adjusted according to the surface potential of the fine particles in the liquid. To be specific, the concentration of salts in the liquid material was adjusted such that an appropriate electric double layer was formed near the surface of the fine particles. Then, a dried film was formed from a droplet of the liquid material via depinning.

As a result, as shown in FIG. 12, a colloid crystal of a close-packed structure (closest packed structure) was observed in the dried film.

[Crystalline Thin Film]

In film formation through depinning, since solids aggregate as a droplet contracts, it is possible to crystallize a low-molecular substance contained as a solute in a liquid material. That is, in the process of a droplet contracting, by creating a supersaturation state, and depositing the solute from its solution, it is possible to crystallize the solute (by aggregation).

In general, in a crystal production process, the degree of difficulty of producing a nucleus varies as the supersaturation concentration is adjusted. If the supersaturation is high, it is easy to produce a crystal nucleus stably, and hence crystals occur everywhere in the liquid. Conversely, if the supersaturation is low, it is difficult to produce a crystal nucleus, and hence supersaturated molecules are used only for growing a nucleus already produced. That is, in the case of producing crystalline particles (thin film), firstly the supersaturation is made high to form a crystal nucleus, and then the supersaturation is made to be insufficient to form a nucleus. Hence crystal growth is accelerated, and it is possible to form crystalline particles (thin film) without producing a new nucleus.

That is, in order to form a crystal film by utilizing depinning, it is preferable to control the concentration of solids in a liquid material, and the drying speed of a droplet. Especially regarding the drying speed of a droplet, it is preferable to combine control elements such as the above-described stage speed, distance between droplets, arrangement of a plurality of droplets and timing of placement, contact angle with the surface of a substrate, and the like, appropriately. By controlling the concentration of solids in a liquid material and the drying speed appropriately, it is possible to form an excellent crystalline thin film.

FIG. 13 shows the change of a film structure in the case where the drying conditions are changed for the purpose of forming a crystalline thin film.

Here, a liquid material containing NaCl as a solute was used. Furthermore, film formation was performed under three conditions, being that the stage speed when the droplet dried was (a) 500, (b) 100000, and (c) 75000. In practice, other control elements for changing the drying speed were also changed.

As a result, in condition (c), an excellent crystalline thin film (a single crystal thin film) was formed via depinning. In condition (a), in the process of a droplet contracting by depinning, crystal nuclei were produced in a number of places in the droplet at almost the same time, and a satisfactory crystalline thin film was not formed. In condition (b), pinning occurred, and crystalline thin films were formed scattered in a ring shape.

FIG. 14 shows, schematically, the relationship between the above-described parameters (concentration of solids in a liquid material and drying speed of a droplet), and the form of a dried film, as has been described.

As shown in FIG. 14, under conditions where the concentration of solids is low and the drying speed is low, a depinned thin film is formed. Under drying conditions where depinning does not occur, a pinned thin film is formed. Then, if the concentration of solids is high, the pinned thin film is thick, and close to a flat film. Furthermore, if the drying speed is high, the elevation of the edge is increased.

As described above, according to a process for forming a film of the present invention, by changing at least either one of the concentration of solids in a liquid material and the drying speed of a droplet, the dried film of the droplet can be controlled to produce a range of shapes. As a result, it is possible to form a film with a desired shape on a substrate accurately and stably. Accordingly, by manufacturing an electronic device using this process for forming a film, it is possible to improve the quality of the device.

Moreover, among pinned thin films, a ring shaped thin film is suited to use as a container for other material or as a base. That is, in the case where another material is placed within the edge of the ring shaped thin film, the elevation at the edge serves as a wall, thus enabling the accuracy of the location of the material to be improved.

Furthermore, since depinned thin films enable fine detail and an improvement of film properties to be achieved, it is possible to utilize them in a range of fields.

For example, a very small film formed via depinning is suitable for use in a range of high definition electronic devices such as semiconductor elements, TFT elements, EL elements, and the like. In the case where a droplet is placed on a substrate using a droplet discharge method, although there is a lower limit to the volume of droplet capable of being discharged, by using this process for forming a film, even if the same apparatus as used conventionally is used, it is possible to easily form a film much smaller than the droplet immediately after landing. In this case, it is possible to form a film similar to or much smaller than an apparatus capable of discharging a femtoliter (fl) of droplet using a conventional apparatus.

Moreover, since a colloid crystal film or a crystalline thin film formed via depinning has high conductivity and purity characteristics, it is suited to use as a thin film in an organic EL, an electrode in an organic TFT, and the like. Furthermore, since a film can be crystallized, structural analysis is easy. Hence it is also possible to use it for structural analysis of proteins and the like in the biological and pharmaceutical fields. Furthermore, it is also possible to use it as an optical element. For example, by placing a hardened resin over the top of a crystalline thin film, it is also possible to use it as a micro lens.

Figure 15:
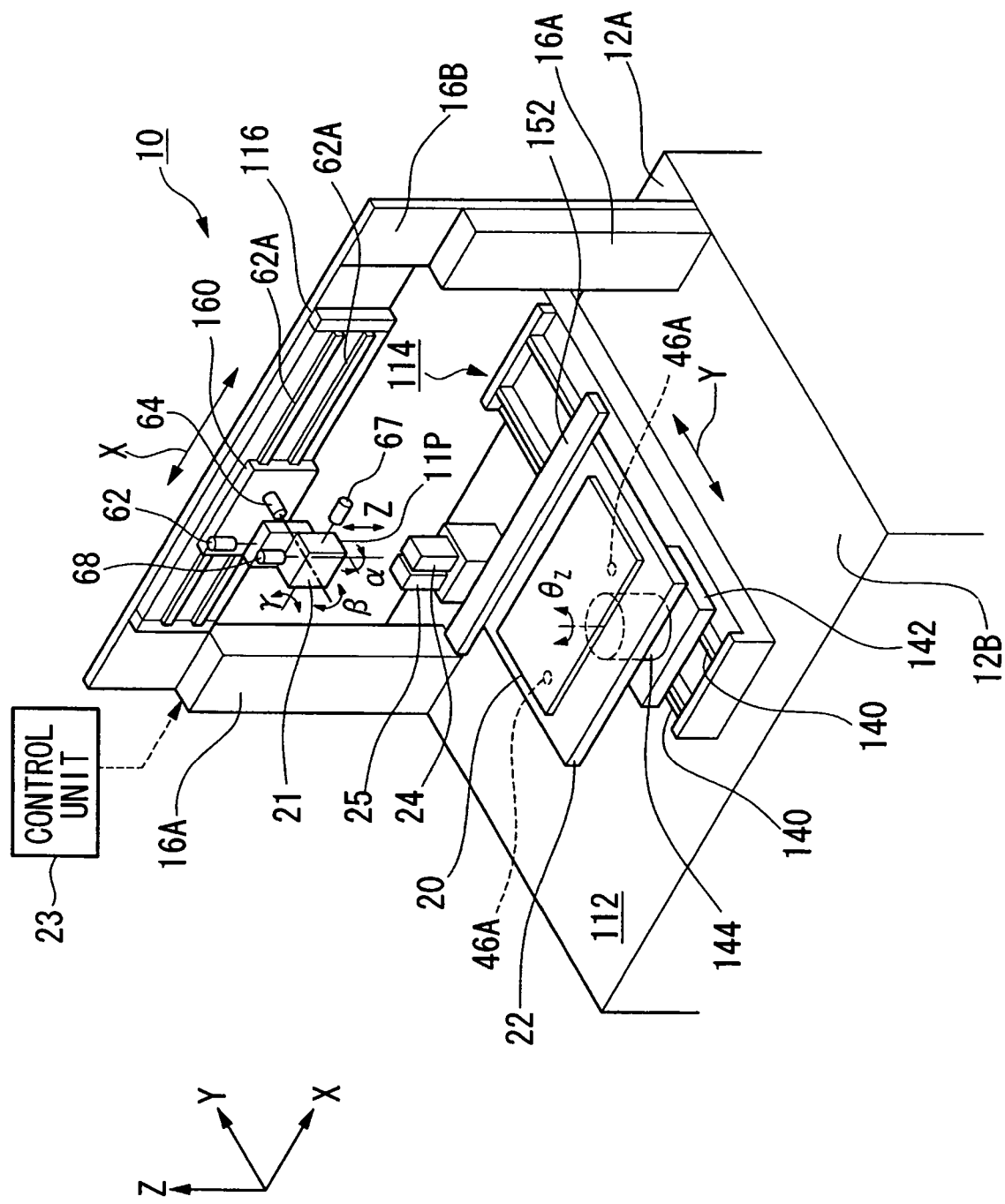
FIG. 15 shows a structural example of an apparatus for forming a film suitable for use in a process for forming a film of the present invention.

FIG. 15 shows a structural example of an apparatus for forming a film suitable for use in a process for forming a film of the present invention.

In FIG. 15, a film forming apparatus 10 comprises a base 112, a substrate stage 22, a first moving device (moving device) 114, which is located between the base 112 and the substrate stage 22, for supporting the substrate stage 22 such that it can move the substrate stage 22, a liquid discharge head 21 capable of discharging liquid to be processed to the substrate 20 supported by the stage 22, a second moving device 116 for supporting the liquid discharge head 21 such that it can move, and a control unit 23 for controlling the operation of discharging a droplet from the liquid discharge head 21. Furthermore, the apparatus for forming a film 10 comprises an electronic scale (not shown in the figure) as a weighing apparatus provided on the base 112, a capping unit 25 and a cleaning unit 24. Moreover, the operation of the film forming apparatus including the first moving device 114 and the second moving device 116 is controlled by the control unit 23.

The first moving device 114 is installed on the base 112, and located along the Y direction. The second moving device 116 stands on columns 16A and 16A on the base 112, which are fixed at the rear 12A of the base 112. The X direction (second direction) of the second moving device 116 is perpendicular to the Y direction (first direction) of the first moving device 114. Here, the Y direction is the direction along the front 12B and back 12A of the base 112. Conversely, the X direction is along the left-right direction of the base 112. Both of them are horizontal. Furthermore, the Z direction is the direction perpendicular to both the X direction and the Y direction.

The first moving device 114 comprises a linear motor for example, has guide rails 140, and a slider arranged such that it can move along the guide rails 140. The slider 142 of this linear motor type first moving device 114 moves along the guide rails 140 in the Y direction, enabling it to be positioned.

Furthermore, the slider 142 has a motor 144 for turning about the Z axis (θZ). This motor 144 is a direct drive motor for example, and the rotor of the motor 144 is fixed on the substrate stage 22. This enables the rotor and the substrate stage 22 to rotate in the θZ direction, and the substrate stage 22 to be indexed (rotary index). That is, the first moving device 114 can move the substrate stage 22 in the Y direction (first direction), and the θZ direction.

The substrate stage 22 holds and positions the substrate 20 in a predetermined location. Moreover, the substrate stage 22 has an adhering and holding device, which is not shown in the figure, and by operating the adhering and holding device, the substrate 20 is adhering and held on the stage 22 via holes 46A in the substrate stage 22.

The second moving device 116 comprises a linear motor, and has a column 16B fixed on the supports 16A and 16A, guide rails 62A, and a slider 160 supported such that it can move in the X direction along the guide rails 62A. The slider 160 moves along the guide rails 62A in the X direction, enabling it to be positioned, and the liquid discharge head 21 is installed on the slider 160.

The liquid discharge head 21 has motors 62, 64, 67 and 68 as rotary positioning devices. When the motor 62 is operated, the liquid discharge head 21 moves up and down the Z axis, enabling it to be positioned. This Z axis is the direction (vertical direction) crossing perpendicular to both the X axis and the Y axis. When the motor 64 is operated, the liquid discharge head 21 rotates about the Y axis in the P direction, enabling it to be positioned. When the motor 67 is operated, the liquid discharge head 21 rotates about the X axis in the y direction, enabling it to be positioned. When the motor 68 is operated, the liquid discharge head 21 rotates about the Z axis in the α direction, enabling it to be positioned. That is, the second moving device 116 supports the liquid discharge head 21 such that it can move in the X direction (first direction), and the Z direction, and also supports this liquid discharge head 21 such that it can move in the θX direction, the θY direction and the θZ direction.

In this manner, the liquid discharge head 21 of FIG. 15 moves straight in the Z axis direction on the slider 160, enabling it to be positioned, and rotates in the α, β, and γ, enabling it to be positioned. Therefore it is possible to accurately control the location and attitude on the substrate 20 of a droplet discharge surface 11P of the liquid discharge head 21. In addition, the droplet discharge surface 11P of the liquid discharge head 21 has a plurality of nozzles provided for discharging droplets.

The liquid discharge head 21 discharges liquid material (resist) from the nozzles by a method known as a liquid discharge method (droplet discharge method). As a liquid discharge method, a range of well-known techniques, such as a piezo method for discharging ink using a piezo element, a method for discharging liquid material by bubbles produced by heating the liquid material, and the like, can be used. Among them, the piezo method does not heat the liquid material. Hence there is an advantage that it does not affect the composition of the material, or the like. Here, in the present example, the above-described piezo method is used.

Figure 16:
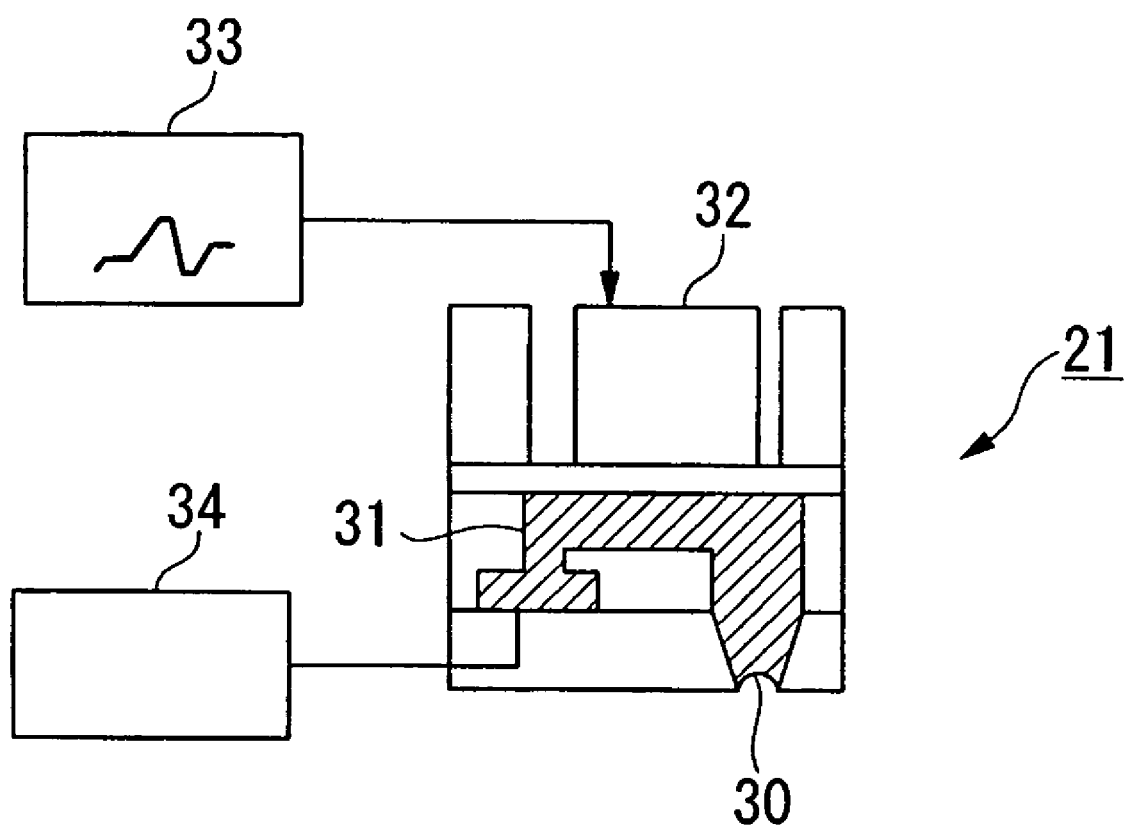
FIG. 16 is a diagram to explain the principle of discharging liquid material by a piezo method.

FIG. 16 is a diagram to explain the principle of discharging liquid material by the piezo method. In FIG. 16, a piezo element 32 is placed adjacent to a liquid chamber 31 storing liquid material. A liquid material is supplied to the liquid chamber 31 via a liquid material supply system 34 containing a material tank for storing the liquid material. The piezo element 32 is linked to a drive circuit 33, and a voltage is applied to the piezo element 32 via the drive circuit 33. By changing the shape of the piezo element 32, the liquid chamber 31 changes shape, and the liquid material is discharged from the nozzle 30. At this time, by changing the value of the applied voltage, the amount of distortion of the piezo element 32 is controlled, and by changing the frequency of the applied voltage, the speed of distortion of the piezo element 32 is controlled. That is, in the liquid discharge head 21, discharge of liquid material from the nozzles 30 is controlled by the applied voltage to the piezo element 32.

Referring to FIG. 15 again, the electronic scale (not shown in the figure) receives 5000 droplets, for example, from the nozzle of the liquid discharge head 21, in order to measure and control the weight of a droplet discharged from the nozzle of the liquid discharge head 21. The electronic scale can measure the weight of a droplet accurately by dividing the weight of the 5000 droplets by 5000. Based on the measured weight of the droplet, it is possible to control the volume of droplets discharged from the liquid discharge head 21 optimally.

The cleaning unit 24 can clean the nozzles and the like of the liquid discharge head 21 periodically or on demand during the manufacturing process, or while waiting. The capping unit 25 caps the droplet discharge surface 11P while waiting, when no device is being manufactured, so that the droplet discharge surface 11P of the liquid discharge head 21 does not dry out.

By the liquid discharge head 21 being moved in the X direction by the second moving device 116, it is possible to position the liquid discharge head 21 above the electronic scale, the cleaning unit 24, or the capping unit 25, selectively. That is, even while a device is being manufactured, it is possible to measure the volume of a droplet if the liquid discharge head 21 is moved to the electronic scale side. Furthermore, if the liquid discharge head 21 is moved above the cleaning unit 24, it is possible to clean the liquid discharge head 21. If the liquid discharge head 21 is moved above the capping unit 25, the droplet discharge surface 11P of the liquid discharge head 21 is capped, thus preventing it from drying out.

That is, the electronic scale, the cleaning unit 24, and the capping unit 25 are placed immediately under the moving path of the liquid discharge head 21 at the rear of the base 112, away from the substrate stage 22. Since the operations for providing and removing material to and from the substrate 20 are performed at the front of the base 112, the operations are not disturbed by the electronic scale, the cleaning unit 24 or the capping unit 25.

As shown in FIG. 15, in part of the substrate stage 22, excluding the part supporting the substrate 20, a preparatory discharge area (preparatory discharge region) 152 is provided separate from the cleaning unit 24 for waste droplets or test droplets (preparatory discharge) from the liquid discharge head 21. This preparatory discharge area 152 is provided at the rear of the substrate stage 22 in the X direction as shown in FIG. 15. This preparatory discharge area 152 is fixed to the substrate stage 22, and comprises a receiving element with a concave cross section shape, which is open at the top, and an absorbing material for absorbing discharged droplets, which is provided in the concave section of the receiving element such that it can be changed as required.

For a substrate 20, a number of types, such as a glass substrate, a silicon substrate, a quartz substrate, a ceramic substrate, a metal substrate, a plastic substrate, a plastic film substrate, or the like, can be used. Furthermore, it also includes substrates of those raw materials on whose surfaces a semiconductor film, a metal film, a dielectric film, an organic film, and the like are formed as base layers. Moreover, for the above-described plastic, polyolefine, polyester, polyacrylate, polycarbonate, polyether sulphone, polyether ketone, or the like may be used.

In addition, in the above-described process for forming a film, when a droplet discharged from the liquid discharge head is placed on the substrate, the drying speed of the droplet is controlled by the movement of the substrate stage. The drying method of a droplet is not limited to this, and a droplet may also be dried using a drying method such as lamp annealing or the like, for example.

Figure 17A:
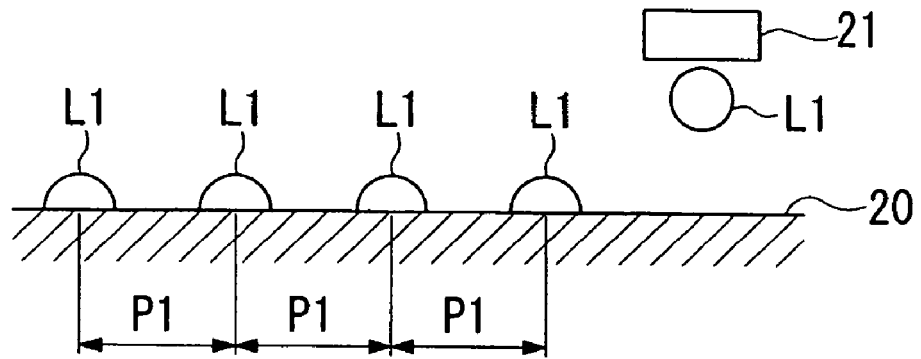
FIGS. 17A, 17B and 17C show an example of a process for forming a linear film pattern on a substrate.
Figure 17B:
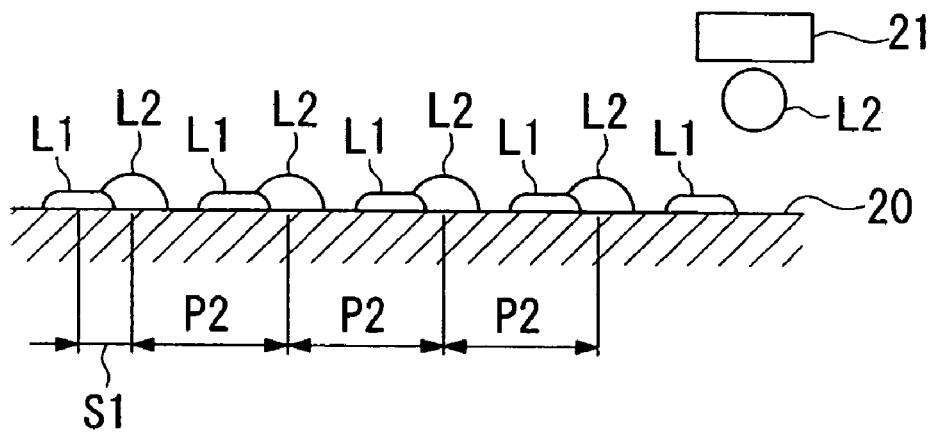
Figure 17C:
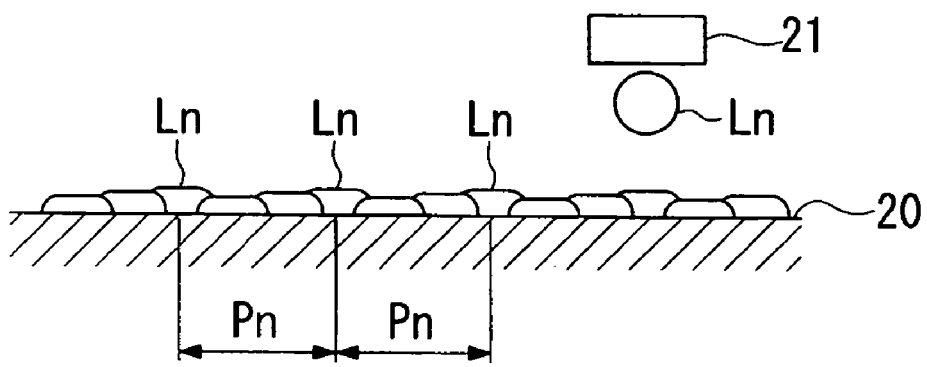

FIG. 17A to 17C show an example of a process for forming a linear film pattern on a substrate using the above-described film forming apparatus 10, as an example of a process for forming a film pattern.

In this film pattern forming process, a liquid material is discharged as droplets from the discharge head 21, and the droplets are placed on the substrate 20 at intervals of a fixed distance (pitch). Then, by repeating this droplet placement operation, a linear film pattern is formed on the substrate 20.

To be specific, as shown in FIG. 17A, firstly, droplets L1 discharged from the discharge head 21 are placed sequentially on the substrate 20 at a fixed spacing.

After the droplets L1 are placed on the substrate 20, a drying process is performed in order to remove liquid (solvent, dispersion medium, and the like). Other than typical heat treatment using a heating device, such as a hot plate, an electric furnace, a hot gas generator, lamp annealing or the like, the drying process may also be performed by moving the stage on which the substrate 20 is mounted. Furthermore, in the present example, as described above, the form of the dried film of a droplet is controlled using at least either one of the concentration of solids in a liquid material, and the drying speed of a droplet, as a parameter.

Next, the above-described droplet placement operation is repeated as shown in FIG. 17B. That is, similarly to the previous occasion as shown in FIG. 17A, a liquid material is discharged as droplets L2 from the discharge head 21, and the droplets L2 are placed on the substrate 20 at a fixed spacing. At this time, the volume of the droplets L2 (volume of liquid material per droplet), and the placement pitch P2 are the same as droplets L1 of the previous occasion. Furthermore, the placement locations of the droplets L2 are shifted from the previous droplets L1 by a predetermined distance S1. That is, the center positions of the droplets L1 placed on the substrate 21 previously and the center positions of the droplets L2 on this occasion are separated by the above-described distance S1. This amount of shift S1 is determined such that it is smaller than the above-described pitches P1 and P2 (S1<P1=P2), and the droplets L1 placed on the substrate 20 previously are partially overlapped by the droplets L2 of this occasion in the present example.

The droplets L2 of this occasion make contact with the previous droplets L1. However, since the liquid of the previous droplets L1 is completely or partially removed, the two almost never combine and spread over the substrate 21. After the droplets L2 are placed on the substrate 21, the drying process is performed similarly to the previous occasion in order to remove liquid.

Afterward, the above-described placement operation is repeated a plurality of times-as shown in FIG. 17C. Each time, the spacing distance (pitch Pn) between droplets Ln placed is the same as the initial time (pitch Pn=P1), and always constant. Furthermore, when the droplet placement operation is repeated a plurality of times, the location at which the placement of droplets Ln starts is shifted by a predetermined distance from the location at which the previous droplets were placed each time. By this repetition of the droplet placement operation, the gaps between droplets placed on the substrate 21 are filled to form a continuous linear pattern. Moreover, a film pattern to be formed on the substrate is formed by droplet placement with the same constant pitch, and since it all goes through almost the same forming process, the structure is uniform.

In a process for forming a film pattern of the present example, the shape of the dried film of droplets is controlled, thus it is possible to form a film pattern of a desired shape on a substrate accurately and stably.

Here, the process for forming a linear shaped pattern is not limited to that shown in FIGS. 17A to 17C. For example, it is possible to set the pitch of placing droplets, the amount of shift at the time of repetition, and the like, as desired.

Figure 18:
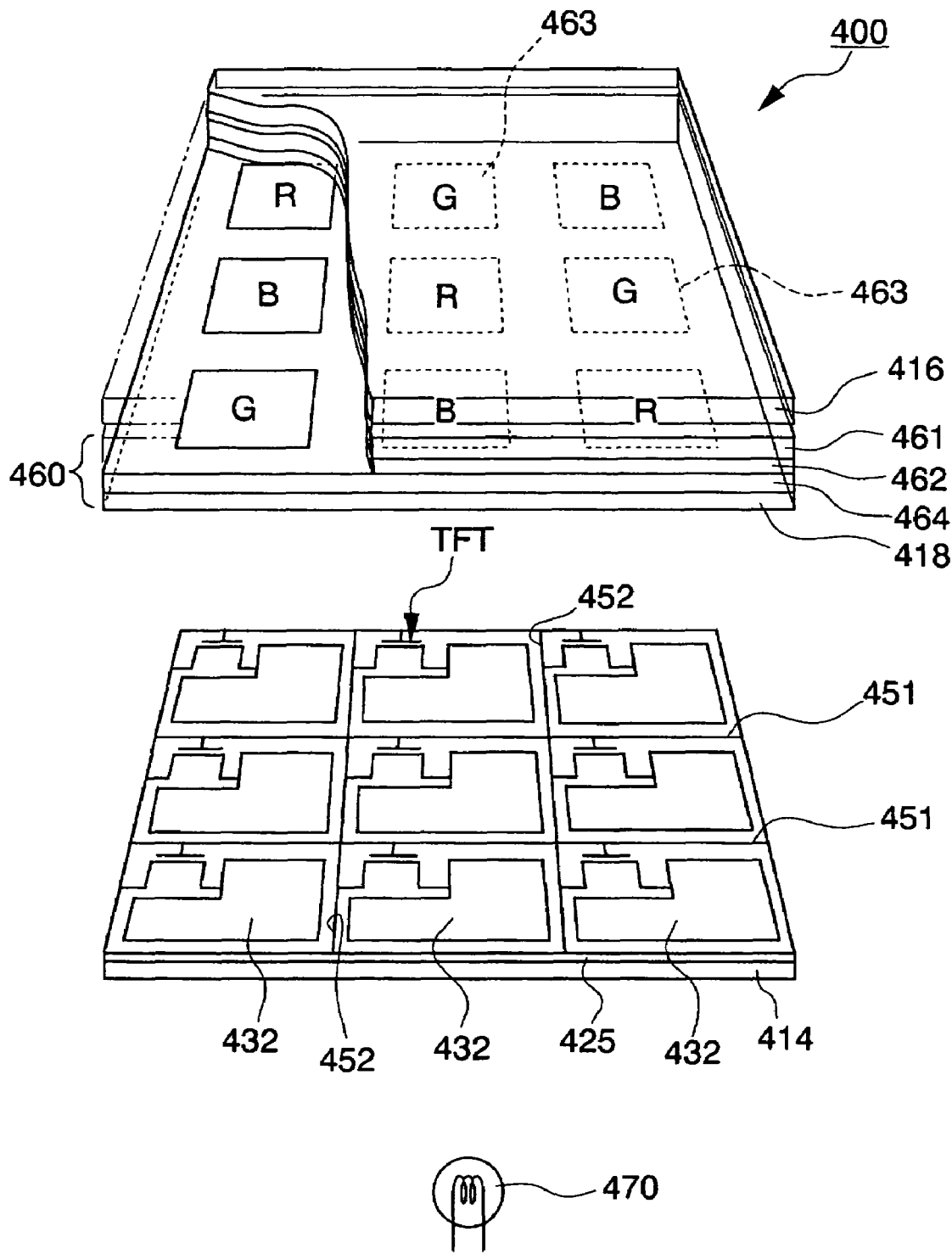
FIG. 18 is a perspective view showing an example of the structure of a liquid crystal display incorporating a color filter manufactured using a process for forming a film of the present invention.

FIG. 18 is a perspective view showing an example of the structure of a liquid crystal display incorporating a color filter manufactured using a first process for forming a film of the present invention.

A liquid crystal display 400 according to the present embodiment is equipped with subsidiary components such as a liquid crystal driving IC (omitted in the figure), wiring and the like (omitted in the figure), a light source 470, a base (omitted in the figure), and the like.

The construction of the liquid crystal display 400 will be described briefly. The liquid crystal display 400 is constructed with a color filter 460 and a glass substrate 414, placed facing each other, a liquid crystal layer sandwiched between them, which is not shown in the figure, a polarizing plate 416 placed on the top side of the color filter 460 (observer's side), and a polarizing plate placed on the bottom side of the glass substrate 414, which is not shown in the figure, as its main parts. The color filter 460 contains a substrate 461 formed from transparent glass, which is provided on the observer's side, and the glass substrate 414 is a transparent substrate provided on the opposite side.

A partition 462 formed from a black photosensitive resin film, a colored section 463, and an overcoat layer 464 are formed in sequence under the substrate 461. Furthermore, a drive electrode 418 is formed under the overcoat layer 464. In addition, in an actual liquid crystal device, a polarizing film is provided on the liquid crystal layer side, covering the electrode 418, and an electrode 432 on the glass substrate 414 side, which is described later. However, the drawing and description are omitted.

The electrode 418 for driving the liquid crystal, which is formed on the liquid crystal layer side of the color filter 460, is a transparent conductive material such as ITO (Indium Tin Oxide) or the like, formed over the whole surface of the overcoat layer 464.

An insulating layer 425 is formed on the glass substrate 414, and TFTs (Thin Film Transistors) serving as switching elements, and pixel electrodes 432, are formed on this insulating layer 425.

Scanning lines 451 and signal lines 452 are formed in a matrix on the insulating layer 425 formed on the glass substrate 414, and pixel electrodes 432 are provided for each region surrounded by the scanning lines 451 and the signal lines 452. The TFTs are fabricated in each section inside the corner sections of the pixel electrodes 432, the scanning lines 451, and the signal lines 452, and the TFTs are switched on or off by signals being applied to the scanning lines 451 and the signal lines 452 to control the flow of electricity to the pixel electrodes 432.

Figure 19:
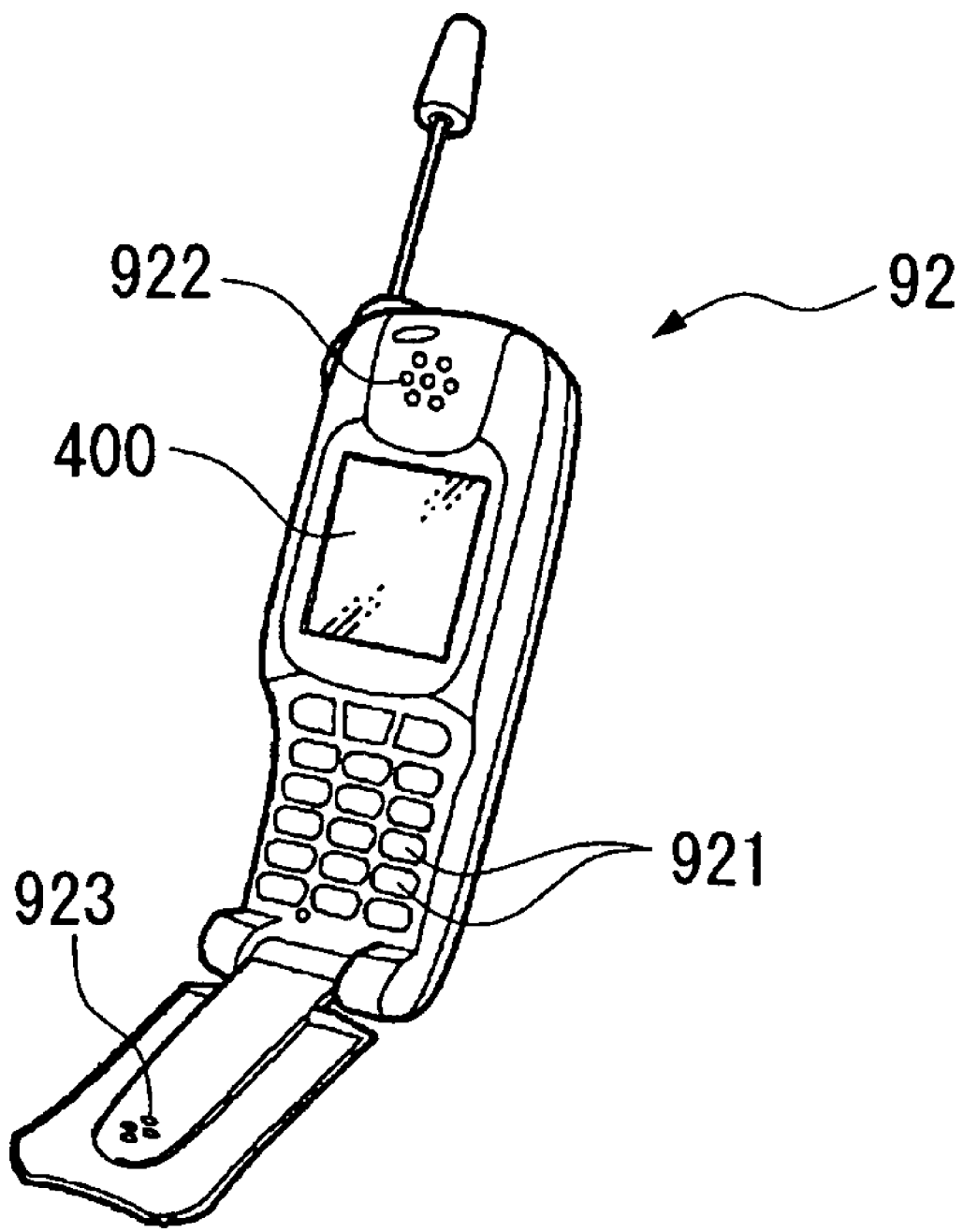
FIG. 19 is a perspective view showing an example of the structure of a mobile telephone, being an example of electronic equipment using a liquid crystal display.

FIG. 19 is a perspective view showing an example of the structure of a mobile telephone, being an example of electronic equipment using the above-described liquid crystal display. In the figure, a mobile telephone 92 has a speaker 922, a microphone 923 and the above-described liquid crystal display 400, as well as a plurality of operating buttons.

FIGS. 20A-20E show an example of a process for forming a film according to a second embodiment of the present invention.

In a process for forming a film of the present example, a first droplet 211 is placed on a substrate 220, a dried film (first film 212) of the first droplet 211 is formed, then a second droplet 213 is placed on the first film 212, and a dried film (second film 214) of the second droplet 213 is formed, and there are provided a liquid repellency step, a first film forming step, and a second film forming step. Here, the liquid materials used for the first droplet 211 and the second droplet 313 are sometimes the same, and sometimes different. Furthermore, to simplify the description, a case is described here in which a dried film of a droplet is formed at one location on a substrate. However, the second process for forming a film of the present invention is not limited to this. For example, a dried film of a droplet may be formed at a plurality of locations on the substrate.

(Liquid Repellency Step)

Figure 20A:
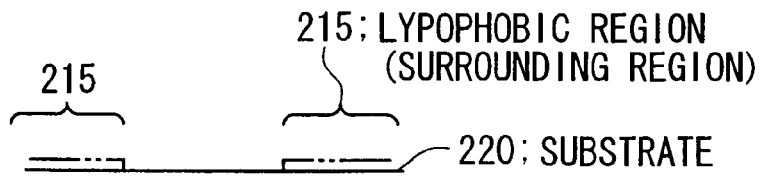
FIGS. 20A to 20E show an example of an embodiment according to a second process for forming a film of the present invention.

Firstly, as shown in FIG. 20A, a region (liquid repellent region 215), which is liquid repellent (incompatible) with respect to a liquid material used for the first droplet 211, is formed in a predetermined pattern on the substrate 220. For the substrate 220, a number of types, such as a glass substrate, a silicon substrate, a quartz substrate, a ceramic substrate, a metal substrate, a plastic substrate, a plastic film substrate, or the like, can be used. Furthermore, it also includes substrates of those raw materials on whose surfaces a semiconductor film, a metal film, a dielectric film, an organic film, and the like are formed as base layers. Moreover, for the above-described plastic, polyolefine, polyester, polyacrylate, polycarbonate, polyether sulphone, polyether ketone, or the like may be used.

For a process for forming a liquid repellent region, there exist a process for forming self-assembled layers on the surface of a substrate, plasma processing (plasma polymerization), eutectoid plating, a method for liquid repellency using gold thiol, and the like, for example. For example, after making the whole surface of the substrate liquid repellent, then by reducing the liquid repellency of the region on which a film is to be formed by applying lyophilic treatment, it is possible to form a liquid repellent region of a predetermined patterned on the substrate. Alternatively, by performing liquid repellent treatment on the surface of the substrate using a mask of a predetermined pattern, a liquid repellent region of a predetermined pattern may be formed on the substrate. In the present example, a liquid repellent region (liquid repellent pattern) is formed from liquid repellent self-assembled monolayers (SAMs). In addition, a process for forming self-assembled monolayers will be described later.

(First Film Forming Step)

Figure 20B:
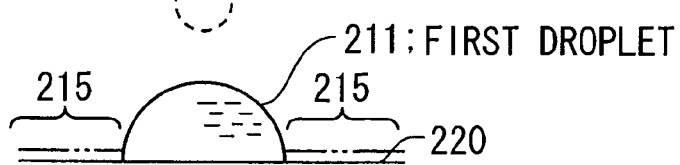

Next, as shown in FIG. 20B, a liquid material is placed as a droplet (first droplet 211) in a region partitioned as a liquid repellent region 215. As a method for placing liquid material, in the present example, a droplet discharge method for discharging liquid material as droplets from a discharge head 21, a so-called inkjet method, is used. In the droplet discharge method, the discharge head 21 and the substrate 220 are moved relative to each other, for example, while droplets 211 are discharged from the discharge head 21 and land on the substrate 220. Here, as a liquid discharge method, a range of well-known techniques, such as a piezo method for discharging ink using a piezo element, a method for discharging liquid material by bubbles produced by heating the liquid material, and the like, can be used. Among them, the piezo method does not heat the liquid material, and hence there is an advantage that it does not affect the composition of the material, or the like. An apparatus for discharging droplets (film forming apparatus) will be described later.

In the present example, when a first droplet 211 is placed on the substrate 220, since the placement region of the first droplet 211 is defined by the liquid repellent region 215, the first droplet 211 is placed in a desired location accurately. That is, even if part of the first droplet 211 discharged from the discharge head 21 falls on the liquid repellent region 215 of the substrate 220, the first droplet 211 is repelled by the liquid repellent region 215, and positioned in a region surrounded by the liquid repellent region 215, whose affinity is comparatively high.

Figure 20C:
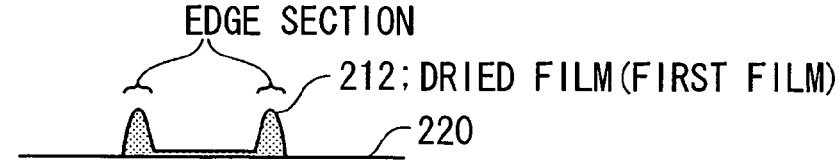

Next, as shown in FIG. 20C, the first droplet 211 placed on the substrate 220 is dried to form a dried film (first film 212). In the present example, by controlling the drying conditions of the first droplet 211, the form of the first film 212 is controlled. To be specific, the first film 212 is formed such that its edge section is thicker than its central part, that is, a form where the edge section is elevated.

FIGS. 1A and 1B, FIG. 2, FIGS. 3A and 3B, FIGS. 4A and 4B, FIG. 5-FIG. 8, FIGS. 9A and 9B, and their descriptions, are applicable to the embodiment of the second process for forming a film of the present invention. Since the descriptions of the figures have already been given, they are omitted here.

Returning to FIG. 20C, in the present example, by controlling the drying conditions of the first droplet 211, the first film 212 is formed such that its edge is thicker than the central part, that is in a form (ring shaped, circular shaped) with an elevated edge section. Furthermore, the shape of the edge section of the first film 212 is formed as desired by controlling the drying conditions of the first droplet 211.

(Second Film Forming Step)

Figure 20D:
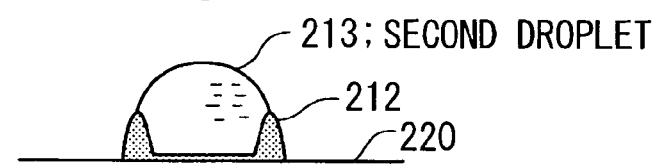

Next, as shown in FIG. 20D, a liquid material is placed as a droplet (second droplet 213) on the first film 212 formed on the substrate 220. In the present example, a droplet discharge method is used as a placement method of the second droplet 213, similarly to the first droplet 211. That is, the liquid material is discharged as a droplet from the discharge head 21, and the droplet (second droplet 213) is placed on top of the first film 212.

Figure 21:
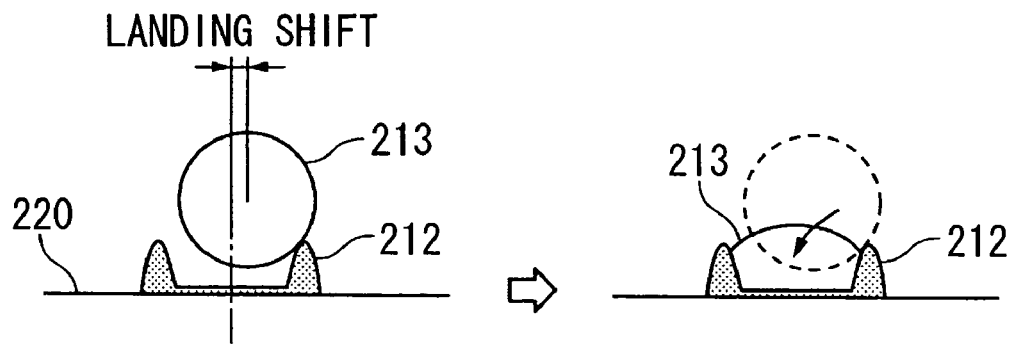
FIG. 21 shows how a second droplet is placed on a first film.
Figure 22:
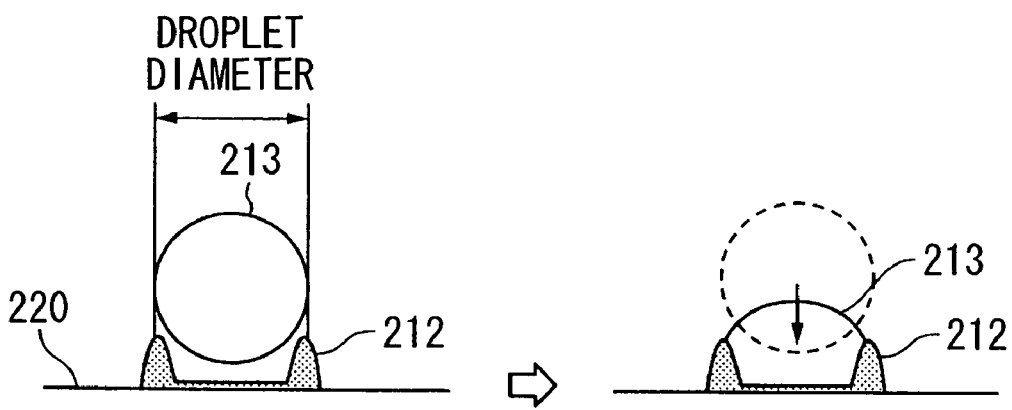
FIG. 22 shows how a second droplet is placed on a first film.

To be specific, the second droplet 213 is placed in the region surrounded by the edge section of the first film 212. At this time, the edge section of the first film 212 functions as a partition, and the second droplet 213 is placed in a desired location accurately, thus preventing it from spreading while still wet (flowing on to the surface of the substrate). That is, as shown in FIG. 21, even if the landing location of the second droplet 213 is shifted slightly from the center of the first film 212, the second droplet 213 touches against the edge section of the first film 212, guiding it to inside the edge section. Furthermore, as shown in FIG. 22, in the case where the diameter of the second droplet 213 is larger than the first film 212, although part of the second droplet 213 falls on the edge section of the first film 212, the second droplet 213 enters the inside region partitioned by the edge section of the first film 212.

In addition, the surface of the first film 212 (specifically, the surface of the edge section) may be made liquid repellent with respect to the second droplet 213 prior to the placement of the second droplet 213. Alternatively, a material containing a substance that is liquid repellent with respect to the second droplet 213 may be used as the material for forming the first film 212. By the surface of the first film 212 being incompatible with the second droplet 213, the second droplet 212 can be placed inside the edge section of the first film 212 more accurately.

Figure 20E:
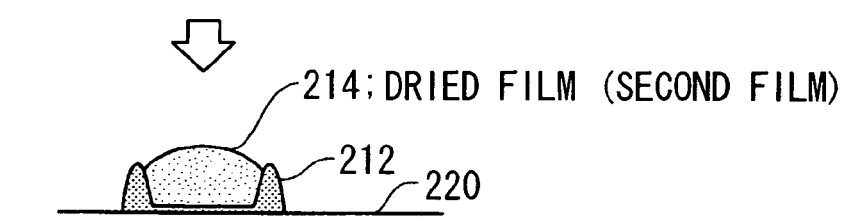

Then, as shown in FIG. 20E, the second droplet 213 placed on the first film 212 is dried to form a dried film (second film 214). The drying conditions of the second droplet 213 are controlled so as to obtain the desired shape or physical properties. In this manner, the second film 214 is formed over the top of the first film 212. That is, a multilayer film containing the first film 212 and the second film 214 is formed on the substrate 220. In the present example, a two layer film is formed. However, more overlapping droplets may be placed to form a film of three or more layers.

As described above, in the second process for forming a film of the present example, the second droplet 213 is placed in the region surrounded by the edge section of the first film 212, and at this time the edge section of the first film 212 serves as a partition. Hence the second droplet 213 is placed in a desired location accurately, and also the second droplet 213 is prevented from spreading while wet. Furthermore, in the present example, since only a part (the edge section) of the first film 212 is used as a partition, it is easy to make the width of the edge and the inside region fine and detailed, and hence it is suitable for use for forming a fine detailed film. Moreover, when forming an edge section as a partition, since the material forming the first film 212 does not need to be removed, the amount of material used can be reduced.

Furthermore, in the second process for forming a film of the present example, since the placement region of the first droplet 211 is defined by the liquid repellent region 215, the first droplet 211 is placed reliably in a desired location of the substrate 220 with high accuracy. As a result of the first droplet 211 being positioned with high accuracy, it is possible to form a dried film (second film 214) of the second droplet 213 in a desired location reliably. Accordingly, by manufacturing a device using this film forming process, it is possible to form a film in a desired location on a substrate stably, thus enabling the quality of the device to be improved.

Here is a description of a process for forming self-assembled monolayers.

Self-assembled monolayers may be formed as follows, for example. Firstly, gold or the like is vacuum deposited on the surface of a substrate. Afterwards, the substrate is cleaned. Then, it is immersed in a thiol compound at a dilution in the proportion of several μ to several tens μmol/l ethanol solution for a predetermined time to create a self-assembled monolayer. Afterwards, the gold surface is cleaned by ethanol and pure water in that order. If required, the gold surface is dried in a nitrogen atmosphere. In the above manner, self-assembled monolayers can be formed. Self-assembled monolayers enable detailed, high standard patterns to be formed easily.

Self-assembled monolayers can be formed using a silane coupling agent (organosilicic compound) or a thiol compound, for example.

Here, a thiol compound is a generic name for an organic compound ($R^1$—SH) containing a mercapto group (—SH). A silane coupling agent is a compound represented by $R^2{}_n SiX_{4-n}$. Specifically, regarding a compound containing fluorine atoms, where $R^1$ or $R^2$ is $C_n F_{2n+1} C_m H_{2m}$, its affinity with other material is low, and its liquid repellency is high. Hence it is suitable as a material for forming a liquid repellent region.

For a method of forming a self-assembled monolayer of a predetermined pattern, a method exists in which a mask layer of a desired shape is formed on a substrate, then a self-assembled monolayer is formed as a film on the substrate, then afterward the mask layer is removed, for example. A resist (light sensitive material) is suitable for use as a mask layer, for example.

Alternatively, after forming a self-assembled monolayer on the substrate, the self-assembled monolayer is patterned by removing a desired part of the self-assembled monolayer, or changing the characteristics (surface energy) of the surface of the desired part, using at least one of an electron beam, an ion beam, and light. The electron beam, ion beam or light (for example, wavelength of 250 nm or less) can be focused into an extremely small spot, and it is possible to control its location easily and with high accuracy. Hence it is possible to create an extremely fine and detailed pattern.

Alternatively, self-assembled monolayers may be patterned by creating a desired stamp (pattern), and after forming a self-assembled monolayer film on the stamp, transferring the self-assembled monolayer to the substrate. The transfer of the self-assembled monolayer may be performed by micro-contact printing, or by ablation by radiating a laser or the like onto the self-assembled monolayer on the stamp. In this method, it is possible to form a plurality of self-assembled monolayers of the same pattern by using one stamp repeatedly, for example.

Figure 23A:
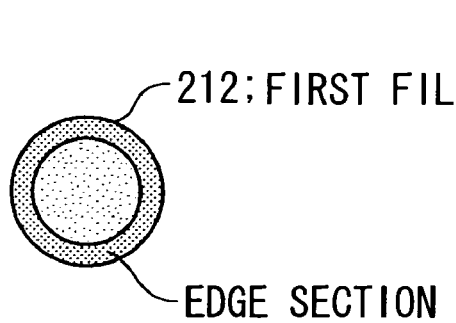
FIGS. 23A and 23B show examples of a flat form of a first film.
Figure 23B:
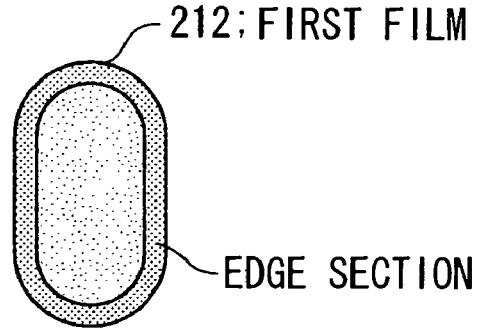

FIGS. 23A and 23B show examples of a flat form of a dried film (first film 212) of a first droplet formed on a substrate.

FIG. 23A shows a dried film formed by a droplet, and an almost circular region is formed inside the edge section. By placing a second droplet in this region, it is possible to form a second film of an almost circular flat form. The second film, whose flat form is almost circular, can be used for a micro lens array for example.

FIG. 23B is a dried film formed by a plurality of droplets combined on the substrate, and dried, and an almost elliptical region is formed inside the edge section. By placing a second droplet in this region, it is possible to form a second film whose flat form is almost elliptical. A film whose flat form is almost elliptical can be used as a film comprising a pixel, or the like. In addition, the region in which the second droplet is placed can be varied in a range of shapes by combining a plurality of droplets on a substrate, and by forming a dried film (first film). At this time, since a liquid repellent region of a predetermined pattern is formed on the substrate, it is possible to form a first film of a desired shape by combining a plurality of droplets according to the liquid repellent region. In the present invention, in the case where a first droplet can be placed at a desired location accurately, a liquid repellent region defining the placement region of the first droplet does not need to be formed specially.

Figure 24A:
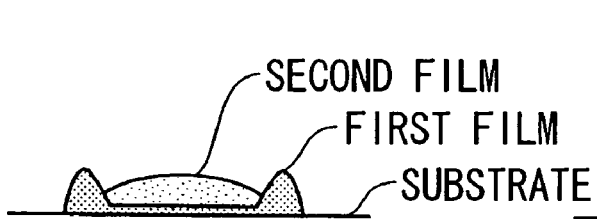
FIGS. 24A and 24B show examples of cross sectional forms of multilayer films (double layer films).
Figure 24B:
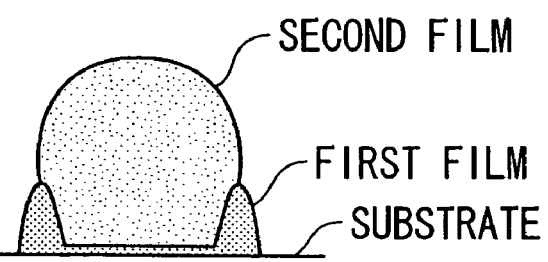

FIGS. 24A and 24B show examples of cross sectional forms of multilayer (double layer) films formed by the second process for forming a film of the present invention.

In the multilayer films shown in FIG. 24A, the top face of the second film is lower than the edge section of the first film, whereas, in the multilayer films shown in FIG. 24B, the top face of the second film is higher than the edge section of the first film. The height and width of the edge section of the first film are determined appropriately according to the thickness of the second film, the physical properties of the forming material, the usage, and the like. In addition, it is possible to achieve a thickening of the second film easily by raising the edge section of the first film.

The multilayer film formed by the process for forming a film of the present example can be applied in a range of fields. For example, there are wiring layouts, color filters, photoresist, micro lens arrays, electroluminescent material, conductive high molecular material, biological material, and the like. In the case where the above-described multilayer film is used in a color filter, a pigment ink for a color filter is used, for example, as the forming material of the second layer. Furthermore, in the case where the above-described multilayer film is used in a micro lens array, a UV hardened resin, a thermosetting resin, or the like is used, for example, as the forming material of the second layer.

The process for forming a film shown in FIG. 15, and the principle of liquid material discharge by the piezo method shown in FIG. 16 are used in the embodiment according to the second process for forming a film of the present invention. Since the description has already been given, it is omitted here.

Furthermore, FIG. 18, FIG. 19 and their descriptions are used for the embodiment of the second process for forming a film of the present invention. However, since the descriptions have already been given, they are omitted here.

A third process for forming a film of the present invention will be described in detail.

FIG. 1B shows, schematically, a typical drying process of a droplet in the first process for forming a film of the present invention.

In the third process for forming a film of the present invention, a liquid material is placed as a droplet on a substrate, and the droplet is contracted, forming a dried film. To be specific, the diameter of the dried film of the droplet is a half or less that of the droplet immediately after being placed on the substrate.

FIG. 5 shows the time integration of the amount of evaporation of liquid (solvent, dispersion medium or the like) from a droplet under fixed drying conditions. Since the detail has already been described, it is omitted here.

FIG. 1A shows the drying process of a droplet in the first process of forming a film of the present invention.

In general, a droplet placed on a substrate dries faster at its edge. Therefore, during the initial stage of drying (region A as shown in FIG. 5), there is a tendency for liquid to evaporate quickly at the edge of the droplet. At this time, when the concentration of solids at the edge of the droplet reaches the saturation concentration, the solids are deposited locally at the edge. Then, the edge of the droplet is in a state of being fixed as though by a pin by the solids deposited, thus restricting the contraction (contraction of the outer diameter) of the droplet during subsequent drying. Hereunder, this phenomenon, that is the phenomenon whereby the contraction of a droplet during drying is restricted by solids deposited at its edge is designated "pinning", and the phenomenon whereby a droplet contracts without pinning when drying is designated "depinning". The third process for forming a film of the present invention is to induce "depinning".

Returning to FIG. 1B, to prevent pinning in order to induce depinning, the drying conditions of a droplet may be determined such that the solids at the edge of the droplet are not deposited, especially during the initial stage of drying. By restricting the solids from being deposited partially at the edge of the droplet, the above-described pinning does not occur, and the droplet contracts by evaporation as the drying proceeds.

That is, the outer diameter of the droplet becomes smaller as the drying proceeds.

In this case, by determining the drying conditions for the droplet such that the concentration of solids throughout the liquid material reaches the saturation concentration at almost the same time, the droplet contracts further. In the process of a droplet contracting, convection currents in the droplet, comprising the flow of liquid from the central part toward the edge, and the flow from the edge toward the central part, are formed continuously, the concentration of local solids in the droplet is prevented from increasing, and the concentration of solids in the droplet is made even. Then, by the concentration of solids in the whole of the droplet reaching the saturation concentration, deposition occurs throughout the droplet at almost the same time. At this time, solidification occurs while the shape of the droplet is maintained during the process of the droplet contracting, and the dried film has almost the same thickness in the central part and at the edge, or the film in the central part is thicker than that at the edge.

Here, the drying conditions for a droplet can be determined by using the concentration of solids in the liquid material or the drying speed of a droplet as a parameter. In a process for forming a film through depinning, it is possible to control the form of a dried film of a droplet and its physical properties using the above-described parameter.

Furthermore, the drying speed of a droplet associated with the above-described parameter changes according to; the moving speed of a stage on which a substrate is mounted, the spacing between droplets (distance between droplets) placed on the substrate, the arrangement of a plurality of droplets and timing of placement, and the contact angle between the surface of the substrate and the liquid material.

For example, when the stage moves, the vapor phase moisture concentration near the droplet falls, and hence the drying of the droplet is accelerated. The greater the moving speed of the stage, the greater the relative moving speed of the droplet against the atmosphere, and hence the drying speed of the droplet increases.

Regarding an embodiment according to the third process for forming a film of the present invention, FIG. 2, FIGS. 3A and 3B, FIGS. 4A and 4B, FIGS. 10A and 10B, FIG. 11A to 11C, FIG. 12, and FIG. 13A to 13C, and their descriptions apply. Since the descriptions have already been given, they are omitted here.

[Close Placement of a Plurality of Dried Films]

Next is a description of a method for forming a plurality of depinned thin films alongside each other on a substrate.

If a plurality of droplets is placed alongside each other on a substrate, and then dried all altogether, the droplets need to be separated by more than the diameter of a droplet in order to avoid the droplets combining before drying. Combination (amalgamation) of the droplets before being dried enlarges the film.

Therefore, by drying a first droplet placed on a substrate, then placing the next droplet, it is possible to form a plurality of adjacent dried films close together. That is, in this process, a first droplet is placed on a substrate, and a dried film of the droplet is formed. Afterwards, the second droplet is placed on the substrate overlapping a part of the dried film of the first droplet, to form a dried film of the second droplet.

FIG. 25 is a diagram to explain a problem when forming depinned thin films close together: plan views at the top, and cross sectional views underneath.

As shown in FIG. 25, in the case where a second droplet is placed on the dried film of a first droplet formed via depinning to form a dried film of the second droplet via depinning, the dried film of the second droplet is sometimes formed such that it covers the dried film of the first droplet. That is, a dried film is formed with the appearance of an enlarged version of the dried film of the first droplet. This phenomenon occurs because the edge of the second droplet is in a state of being fixed as though by a pin by the dried film of the first droplet, thus restricting the contraction of the subsequent second droplet. That is, it occurs because the dried film of the first droplet causes pinning (a pinning site) in the drying process of the second droplet. In order to avoid this phenomenon, the drying conditions of the first droplet and the second droplet may be different.

FIG. 26 is a diagram to explain a process for forming depinned thin films close and alongside each other: plan views at the top, and cross sectional views underneath.

In the process shown in FIG. 26, similarly to the process shown in FIG. 25, after a first droplet is placed on a substrate, and a dried film of the first droplet is formed, a second droplet is placed on the substrate, partially overlapping. During the initial drying stage of the second droplet, the drying conditions are the same as the first droplet, so the contraction of the second droplet starts similarly to that of the first droplet. Then, after the second droplet starts to contract, the drying conditions for the second droplet are changed.

To be specific, after the second droplet starts to contract, the drying conditions for the second droplet are changed such that the drying speed of the second droplet is greater. The drying conditions may be changed using the moving speed of a substrate stage, environmental factors such as temperature, humidity, air pressure, and the like, and also the amount of heating, the amount of air distribution, and the like, for example. It is preferable that the timing of starting the change of the drying conditions is after the second droplet starts to contract, and before the edge of the second droplet reaches the dried film of the first droplet. Changing the drying conditions, as shown in FIG. 26, prevents the dried film of the first droplet functioning as a pinning site during the process of the second droplet contracting. Hence it is possible to form a dried film of the second droplet close alongside the first dried film.

As described above, during the process of a droplet contracting, convection currents in the droplet, comprising the flow of liquid from the central part toward the edge, and the flow from the edge toward the central part, are formed continuously, and the concentration of local solids in the droplet is prevented from increasing. When the drying is accelerated partway through the second droplet contracting by the above-described change of the drying conditions, the convection currents are maintained in the droplet, and the droplet contracts immediately. Hence, the edge of the second droplet climbs over the dried film of the first droplet. As a result, it is possible to form the dried film of the second droplet close alongside the first dried film. This enables the same form of dried film to be formed for both the first droplet and the second droplet.

Figures 27A, 27B, 27C:
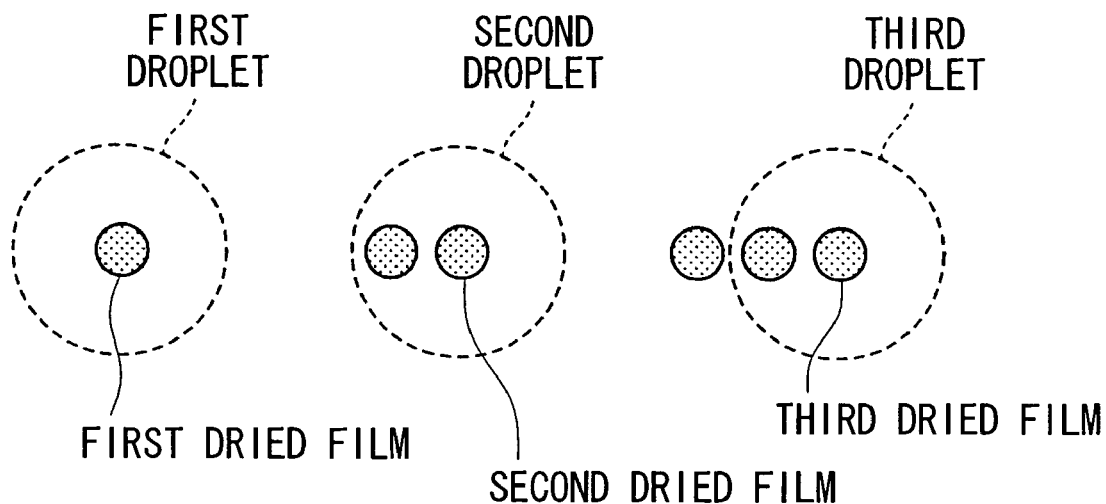
FIGS. 27A, 27B and 27C show, schematically, depinned thin films formed close and alongside each other.

FIGS. 27A, 27B and 27C show, schematically, depinned thin films formed close alongside each other.

Here, the liquid material of the dispersion medium was water, a dispersoid was Ag colloid (particle size about 10 μm), the concentration of solids was 0.5 vol %, and a Si substrate was used. The volume of the droplet (discharged amount) was 10 pl (picoliters), the distance between droplets was 20 μm, and the stage speed was 500 μm/s.

Furthermore, after a dried film of a first droplet was formed via depinning, a second droplet was placed on the substrate, and partway through the second droplet contracting, air was blown over the droplet, accelerating the drying of the second droplet. Similarly, partway through a third droplet contracting, air was blown over the droplet.

As a result, as shown in FIGS. 27B and 27C, a plurality of depinned thin films was formed alongside each other. The diameter of each dried film was 15 μm, and the spacing between the dried films was 5 μn (distance between droplets 20 μm).

Figure 28A:
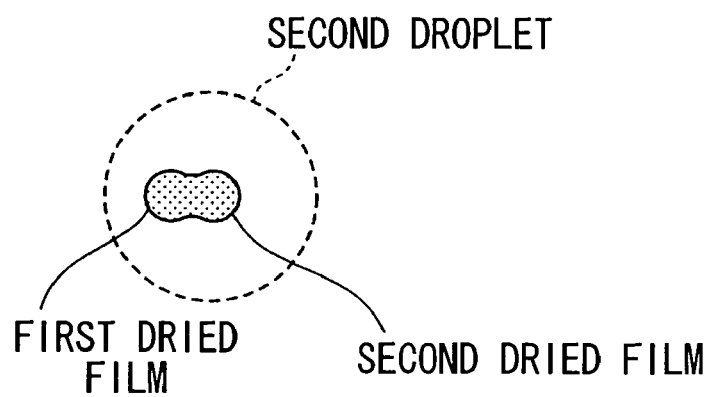
FIGS. 28A and 28B show, schematically, another example in which depinned thin films are formed close alongside each other.
Figure 28B:
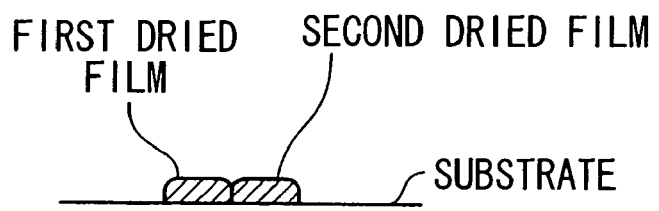

FIGS. 28A and 28B show, schematically, another example in which depinned thin films are formed close alongside each other.

Here, the distance between droplets was 15 μm, and other conditions were the same as in the case of FIG. 13.

As a result, as shown in FIG. 28A, a plurality of (two here) adjoining depinned thin films was formed. The diameter of each dried film was 15 μm, and the distance between the droplets was 15 μm, so the edge sections of the dried films made contact with each other.

When the film thickness distribution of the dried films was observed, the dried film of the first droplet and the dried film of the second droplet had almost the same film thickness profiles as shown in FIG. 28B.

As described above, according to the process for forming a film of the present invention, by forming a dried film by a droplet contracting in the drying process, fine detail, and an improvement in film properties, can be achieved. Hence it is possible to form a film having a range of characteristics, such as a very small film, a colloid crystal film, a crystalline thin film and the like. Accordingly, by manufacturing an electronic device using this process for forming a film, it is possible to improve the quality of the device.

A very small film formed by this process for forming a film is suitable for use in a range of high definition electronic devices such as semiconductor elements, TFT elements, EL elements, and the like. In the case where a droplet is placed on a substrate using a droplet discharge method, although there is a lower limit to the volume of a droplet capable of being discharged, by using this process for forming a film, even if the same apparatus as used conventionally is used, it is possible to easily form a film much smaller than a droplet immediately after landing. In this case, it is possible to form a film similar to or much smaller than for an apparatus capable of discharging a femtoliter (fl) of droplet using a conventional apparatus.

Since a colloid crystal film or a crystalline thin film formed by this process for forming a film has high conductivity and purity characteristics, it is suitable for use as a thin film in an organic EL, an electrode in an organic TFT, and the like. Furthermore, since a film can be crystallized, structural analysis is easy. Hence it is also possible to use it for structural analysis of proteins and the like in the biological and pharmaceutical fields. Furthermore, it is also possible to use it as an optical element. For example, by placing a hardened resin over the top of a crystalline thin film, it is also possible to use it as a micro lens.

The film forming apparatus shown in FIG. 15, and the principle of discharging liquid material by the piezo method shown in FIG. 16, are applicable to an embodiment according to the third process for forming a film of the present invention. Since the descriptions have already been given, they are omitted here.

FIGS. 17A, 17B and 17C and their descriptions are applicable to the embodiment according to the third process for forming a film of the present invention. However, the special feature of the present embodiment is that a droplet is contracted to form a dried film (depinning).

In the present embodiment, since a droplet is contracted to form a dried film, the dried film of each droplet can be made very small. Therefore, it is possible to form a high definition film pattern.

FIG. 18, FIG. 19 and their descriptions are applicable to the embodiment according to the third process for forming a film of the present invention. However, since the descriptions have already been given, they are omitted here.

In addition, the usage of a droplet discharge apparatus is not limited to the patterning of a color filter used in an electro-optical device, and it can be used to form a range of film patterns as follows. For example, it can be used to form thin films such as organic EL layers contained in organic EL (electroluminescent) display panels, hole injection layers, and the like. In the case of forming an organic EL layer, a droplet containing an organic EL material such as a polythiophene system electroconductive polymer, is discharged toward a region divided by a partition formed on a substrate, and the droplet is placed in the region. By the liquid material placed in this manner being dried, an organic EL layer is formed.

Furthermore, other uses of the droplet discharge apparatus are to form devices such as auxiliary wiring layouts of transparent electrodes contained in plasma displays, and antennas contained in IC (integrated circuit) cards. To be specific, after a solution in which conductive fine particles, such as silver fine particles, are mixed into an organic solution such as tetradecane, is patterned by using a droplet discharge apparatus, when the organic solution dries out, a metal thin film layer is formed.

Other than the above-described, a droplet discharge apparatus can also be used for the placement of a range of material, such as micro lens array material, and biological material such as DNA (deoxyribonucleic acid) and proteins, as well as thermosetting resin, ultraviolet curable resin and the like used for stereo lithography.

Moreover, for electronic equipment, other than a mobile telephone, there are computers, projectors, digital cameras, movie cameras, PDAs (Personal Digital Assistants), vehicle equipment, copying machines, audio equipment, and the like.

The above is a description of suitable embodiments according to the present invention with reference to the appended drawings. However, needless to say the present invention is not limited to these examples. Just one example of the shape of each of the components, their combinations, and the like, is shown in the above examples. Therefore, a range of modifications is possible based on design requirements and the like, within the scope of the gist of the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a device on a substrate, the method comprising:
    depositing a first liquid material on the substrate;
    drying the first liquid material to form a first film, the first film including a first portion and a second portion, the first portion being surrounded by the second portion, a thickness of the second portion being greater than a thickness of the first portion;
    depositing a second liquid material on the first portion; and
    drying the second liquid material to form a second film.
2. The method of forming the device on the substrate according to claim 1, the method further comprising:
    depositing a third liquid material on the second film; and
    drying the third liquid material to form a third film.

3. The method of forming the device on the substrate according to claim 2, the third liquid material including resin.

4. The method of forming the device on the substrate according to claim 1, the method further comprising:
conducting a first repelling treatment on a portion of the substrate to define an area to be deposited with the first liquid material.

5. The method of forming the device on the substrate according to claim 4, the first repelling treatment including a self-assembled monolayer (SAM) method.

6. The method of forming the device on the substrate according to claim 4, the method further comprising:
conducting a second repelling treatment on a surface of the second potion before the depositing of the second liquid material to enhance a repellent property of the surface of the second portion against the second liquid material.

7. The method of forming the device on the substrate according to claim 1, the step of depositing of the first liquid material including depositing the first liquid material by setting a parameter of the first liquid material such that the first liquid material is formed thicker in an area where the second portion is to be formed than an area where the first portion is to be formed.

8. The method of forming the device on the substrate according to claim 7, the first liquid material including a solid material, setting the parameter including setting a concentration of solid material in the first liquid material, the concentration of the solid material being configured to be saturated faster in an area where the second portion is to be formed than in an area where the first portion is to be formed.

9. The method of forming the device on the substrate according to claim 7, setting the parameter including setting a drying rate of the first liquid material, the first liquid material being configured to dry faster in an area where the second portion is to be formed than in an area where the first portion is to be formed.

10. The method of forming the device on the substrate according to claim 9, the substrate being mounted on a stage that moves, setting the drying rate including changing a moving speed of the stage.

* * * * *